United States Patent
Wada et al.

(10) Patent No.: US 6,555,423 B2
(45) Date of Patent: Apr. 29, 2003

(54) METHOD OF MANUFACTURING A THIN FILM TRANSISTOR AND A METHOD OF EVALUATING A POLYSILICON FILM

(75) Inventors: Hiroyuki Wada, Kanagawa (JP); Makoto Takatoku, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/912,713

(22) Filed: Jul. 25, 2001

(65) Prior Publication Data

US 2002/0110962 A1 Aug. 15, 2002

(30) Foreign Application Priority Data

Jul. 27, 2000 (JP) .................................. 2000-227807

(51) Int. Cl.[7] ........................... H01L 21/00; H01L 21/84
(52) U.S. Cl. ........................ 438/166; 438/487; 438/488; 438/535
(58) Field of Search .................. 483/487, 488, 483/525, 166, 158, 535; 257/59, 72, 64, 70, 75

(56) References Cited

U.S. PATENT DOCUMENTS 6,020,224 A * 2/2000 Shimogaichi et al. ....... 438/158
6,187,088 B1 * 2/2002 Okumura ....................... 117/8

* cited by examiner

*Primary Examiner*—Olik Chaudhuri
*Assistant Examiner*—Hsien Ming Lee
(74) *Attorney, Agent, or Firm*—Jay H. Maioli

(57) ABSTRACT

In manufacturing a thin-film transistor the condition of a polysilicon film is evaluated, a manufacture margin for the film is determined from the condition evaluated, and the power of an excimer laser annealing apparatus is set based on the manufacture margin. The annealing apparatus anneals an amorphous silicon film, converting the same to a polysilicon film. The surface spatial structure of the polysilicon film thus formed exhibits linearity or periodicity, or both, depending on the energy applied to the amorphous silicon film during the annealing. The image data of the polysilicon film is processed, thereby determining the linearity and/or periodicity in numerical values, by utilizing the auto-correlation function of the surface image of the polysilicon film. A difference between the auto-correlation function of the surface image of parts of the polysilicon film, which are a source region and a drain region, and the auto-correlation function of the part of the polysilicon film, which lies above a gate electrode, is obtained, and the manufacture margin of the polysilicon film is calculated from this difference.

6 Claims, 18 Drawing Sheets

LINEARITY

PERIODICITY

SHIFTED SIDEWAYS →

MANY LINES OVERLAPPING

METHOD OF MANUFACTURING A THIN FILM TRANSISTOR AND A METHOD OF EVALUATING A POLYSILICON FILM

BACKGROUND OF THE INVENTION

1. Field of the Invention

The present invention relates to a system and method for manufacturing a thin-film transistor of bottom-gate structure, having a gate electrode formed between the substrate and a polysilicon film. The invention also relates to a method of evaluating a polysilicon film and an apparatus for inspecting a polysilicon film.

2. Related Art

In recent years, thin-film transistors with a channel layer that is made of polysilicon have been put to practical use. Thin-film transistors having a channel layer made of polysilicon exhibits very high electric-field mobility. When used in the drive circuit of, for example, a liquid crystal display, these thin-film transistors will enable the display of images of high color quality, operate at high speed, and will render the display smaller in size.

In recent years, the so-called "low-temperature polycrystallization process" has been developed. In this process, an excimer laser applies heat to amorphous silicon, forming a polysilicon film. The process may be applied to a method of manufacturing thin-film transistors, thereby to suppress thermal damage to the glass substrate and utilize a large, inexpensive heat-resistant glass substrate.

Excimer lasers, which may be used in the low-temperature polycrystallization process, output but an unstable power. The grain size of the polysilicon film they form inevitably varies so much. The polysilicon film may not always have a desired grain size. The silicon crystals may be too small, resulting in so-called "linear error." Conversely, they may be too large, resulting in so-called "write error."

In most processes of annealing amorphous silicon by an excimer laser, the data representing the energy applied to the amorphous silicon is fed back to the escimer laser. Based on the information, the energy density of the excimer laser beam is changed to an optimal one.

The visual or sensual inspection is only one method available for evaluating the resultant polysilicon film. In the sensual method, the surface of the film is photographed by the use of a spectral ellipsometer, a scanning electron microscope, or the like, and the photograph is examined to determine the crystal condition of the film. In other words, the crystal condition of the film cannot be determined by any non-contact, objective inspections.

BRIEF SUMMARY OF THE INVENTION

The present invention has been made in consideration of the foregoing. An object of the invention is to provide a system and method for manufacturing thin-film transistors having a polycrystalline film formed by using an laser annealing apparatus that emits a laser beam having energy density optimized based on the crystal condition of the film, which has been evaluated by an objective, non-contact, automatic inspection at high accuracy. Another object of the invention is to provide a method of evaluating such a polysilicon film. A further object is to provide an apparatus for inspecting such a polysilicon film.

A system for manufacturing a thin-film transistor, according to the present invention comprises: a film-forming apparatus for forming a metal pattern on a substrate and forming amorphous silicon film on the substrate, covering the metal pattern; a laser annealing apparatus for annealing the amorphous silicon film, converting the same to a polysilicon film that serves as a channel layer; observation means for observing a surface spatial structure of the polysilicon film; and a polysilicon-inspecting apparatus for evaluating the surface spatial structure observed by the observation means, thereby to determine the condition of the polysilicon film. The polysilicon-inspecting apparatus evaluates, in numerical values, the surface spatial structure of a part of the polysilicon film, which lie above the metal pattern, and the surface spatial structure of the other parts of the polysilicon film. The polysilicon-inspecting apparatus calculates a difference between the numerical value of the part of the polysilicon film, which lies above the metal pattern, and the numerical value of the other parts of polysilicon film. It determines the condition of the polysilicon film from the difference calculated. The laser annealing apparatus uses the difference as a control parameter for controlling the energy density of the laser beam, and the film-forming apparatus uses the difference as a control parameter for controlling the thickness of the polysilicon film.

In the system, the surface spatial structure of that part of the polysilicon film, which lies above the metal pattern, is evaluated in a numerical value, and the surface spatial structure of the other parts of the polysilicon film is evaluated in a numerical value, too. Then, a difference between the numerical value of the part of the polysilicon film, which lies above the metal pattern, and the numerical value of the other parts of polysilicon film is calculated. The energy density of the laser beam or the thickness of the polysilicon film is set by using the difference as a control parameter.

In a method of manufacturing a thin-film transistor, according to this invention, a laser annealing apparatus anneals an amorphous silicon film, thus converting the film to a polysilicon film that serves as a channel layer. The method comprises: forming a metal pattern on a substrate; forming an amorphous silicon film on the substrate, thereby covering the metal pattern; performing laser annealing on a plurality of parts of the amorphous silicon film formed on one or more substrates, at different energy densities of a laser beam, thereby forming a polysilicon film; evaluating, in numerical value, the surface spatial structure of that part of the polysilicon film, which lies above the metal pattern; evaluating, in numerical value, the surface spatial structure of the other parts of the polysilicon film; calculating a difference between the numerical value of the part of the polysilicon film, which lies above the metal pattern, and the numerical value of the other parts of polysilicon film; and controlling the energy density of the laser beam or the thickness of the polysilicon film, by using the difference as a control parameter for controlling the energy density and the thickness.

In the method of manufacturing a thin-film transistor, the surface spatial structure of that part of the polysilicon film formed by means of the laser annealing apparatus, which lies above the metal pattern, is evaluated in a numerical value, and the surface spatial structure of the other parts of the polysilicon film is evaluated in a numerical value, too. A difference between the numerical value of the part of the polysilicon film, which lies above the metal pattern, and the numerical value of the other parts of polysilicon film is calculated. The energy density of the laser beam or the thickness of the polysilicon film is set by using the difference as a control parameter.

According to the invention there is provided a method of evaluating a polysilicon film serving as a channel layer and provided in a thin-film transistor that comprises a substrate, a metal pattern provided on the substrate and a channel layer, said polysilicon film having been formed by forming an amorphous silicon film on the substrate and performing laser annealing on the amorphous silicon film. The method comprises: evaluating a surface spatial structure of a part of the polysilicon film, which lines above the metal pattern, in a numerical value; evaluating surface spatial structure of other parts of the polysilicon film, in a numerical value; and calculating a difference between the numerical value of the part of the polysilicon film, which lies above the metal pattern, and the numerical value of the other parts of polysilicon film, and evaluating the polysilicon film based on the difference calculated.

In the method of evaluating a polysilicon film, the surface spatial structure of the polysilicon film formed by the laser annealing is evaluated in a numerical value. The condition of the polysilicon film is evaluated based on the difference between the numerical value of the part of the polysilicon film, which lies above the metal pattern, and the numerical value of the other parts of polysilicon film is calculated.

According to the invention there is provided an apparatus for inspecting a polysilicon film serving as a channel layer and provided in a thin-film transistor that comprises a substrate, a metal pattern provided on the substrate and a channel layer, said polysilicon film having been formed by forming an amorphous silicon film on the substrate and performing laser annealing on the amorphous silicon film. The apparatus for inspecting a polysilicon film comprises: observation means for observing a surface spatial structure of the polysilicon film; and inspecting means for inspecting the surface spatial structure observed by the observation means, thereby to determine the condition of the polysilicon film. The inspecting means evaluates, in numerical values, the surface spatial structure of a part of the polysilicon film, which lie above the metal pattern, and the surface spatial structure of the other parts of the polysilicon film, calculates a difference between the numerical value of the part of the polysilicon film, which lies above the metal pattern, and the numerical value of the other parts of polysilicon film, and determines the condition of the polysilicon film from the difference calculated.

In the apparatus for inspecting a polysilicon film, the surface spatial structure of the polysilicon film formed by the laser annealing is evaluated in a numerical value. The condition of the polysilicon film is evaluated based on the difference between the numerical value of the part of the polysilicon film, which lies above the metal pattern, and the numerical value of the other parts of polysilicon film is calculated.

In the system and method for manufacturing thin-film transistors, both according to the present invention, the surface spatial structure of a polysilicon film formed by a laser annealing apparatus is evaluated in a numerical value. A difference between a part of the polysilicon film, which lies above a metal pattern, and the other parts of the polysilicon film is calculated in terms of the numerical values. The difference calculated is used as a control parameter, adjusting the energy density of the laser beam emitted by the laser annealing apparatus or setting the thickness of the polysilicon film.

With the system and method it is therefore possible to set the intensity of the laser beam emitted from the laser annealing apparatus, at an optimal value. This can enhance the yield of the thin-film transistor.

In the method of evaluating a polysilicon film, according to this invention, the surface spatial structure of a polysilicon film formed by a laser annealing apparatus is evaluated in a numerical value. A difference between a part of the polysilicon film, which lies above a metal pattern, and the other parts of the polysilicon film is calculated in terms of the numerical value. The condition of the polysilicon film is evaluated from the difference thus calculated.

With this method it is easy to evaluate the polysilicon film in a non-destructive manner. In addition, it is possible to evaluate the film in a numerical value, unlike in a visual or sensual inspection. Hence, the polysilicon film can be automatically evaluated. Thus, an objective inspection can be achieved at high accuracy.

In the apparatus for inspecting a polysilicon film, according to the invention, the surface spatial structure of a polysilicon film formed by a laser annealing apparatus is evaluated in a numerical value. A difference between a part of the polysilicon film, which lies above a metal pattern, and the other parts of the polysilicon film is calculated in terms of the numerical value. The condition of the polysilicon film is evaluated from the difference thus calculated.

The inspection apparatus can easily evaluate the polysilicon film in a non-destructive manner. Additionally, it can evaluate the film in a numerical value, unlike in a visual or sensual inspection. Therefore, it can evaluate the polysilicon film automatically. Thus, the apparatus can perform an objective, high-accuracy inspection.

DETAILED DESCRIPTION OF THE INVENTION

An apparatus for evaluating polysilicon films, which is an embodiment of the present invention, will be described.

The apparatus is designed to evaluate a polysilicon film formed in one of the steps of manufacturing a thin-film transistor of bottom-gate structure (herein after referred to as "bottom-gate TFT"). A bottom-gate TFT comprises, for example, a glass substrate, a gate electrode provided on the substrate, a gate insulating film covering the gate electrode, and a polysilicon film (channel layer) provided on the gate insulating film. The gate electrode is interposed between the glass substrate and the polysilicon film, i.e., the channel layer.

Structure of the Bottom-Gate TFT

The structure of a bottom-gate TFT will be described in more detail, with reference to FIG. 1.

Figure 1:
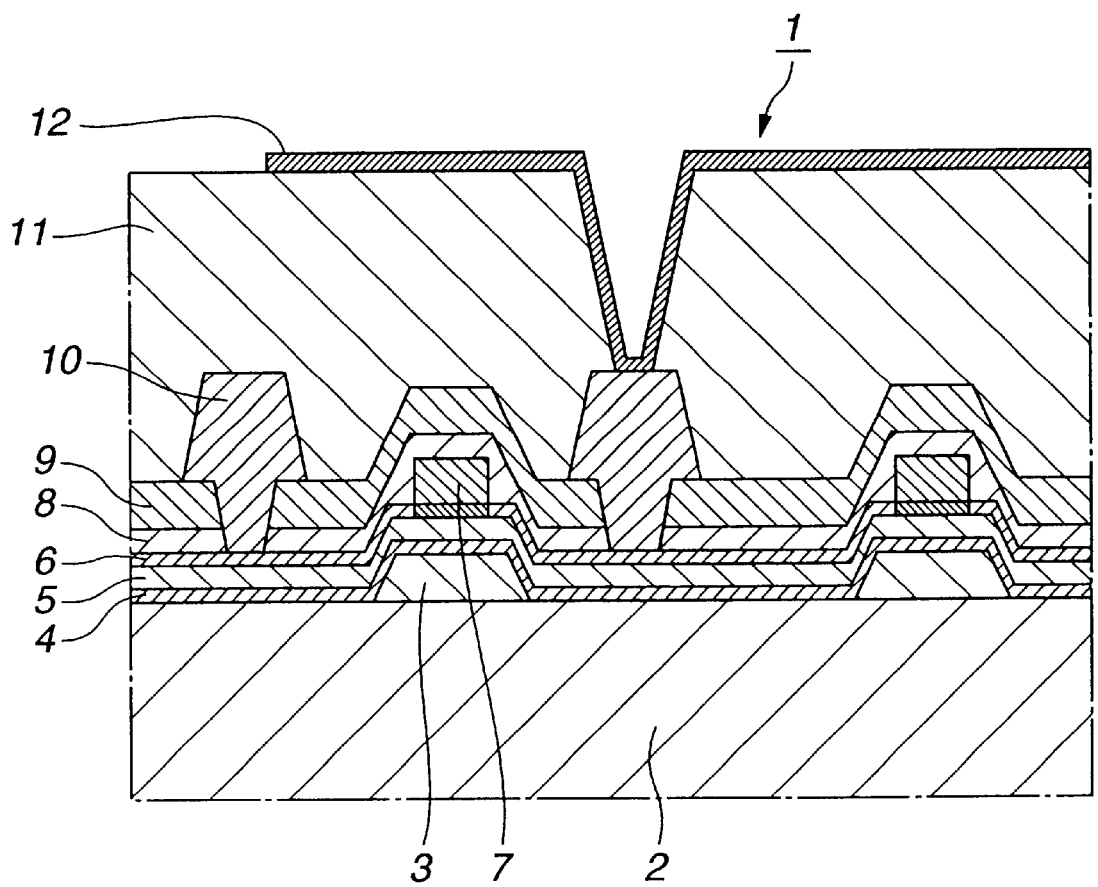
FIG. 1 is a sectional view of a TFT (Thin-Film Transistor) of bottom-gate structure.

As shown in FIG. 1, the bottom-gate TFT 1 has a glass substrate 2 that is 0.7 mm thick. On the glass substrate 2, a gate electrode 3, a first gate insulating film 4, a second gate insulating film 5, a polysilicon film 6, a stopper 7, a first inter-layer insulating film 8, a second inter-later insulating film 9, wires 10, a flattening film 11 and a transparent conductive film 12 are formed, one upon another in the order they are mentioned.

The gate electrode 3 has been formed in two steps. In the first step, a molybdenum (Mo) layer is formed to a thickness of 100 to 200 nm, on the glass substrate 2. In the second step, the molybdenum layer is patterned by means of anisotropic etching.

The first gate insulating film 4 is made of silicon nitride ($SiN_x$) and has a thickness of, for example, 50 nm. The film 4 is formed on the glass substrate 2, covering the gate electrode 3 provided on the glass substrate 2.

The second gate insulating film 5 is made of silicon dioxide ($SiO_2$) and has a thickness of, for example, 200 nm. The film 5 is formed on the first gate insulating film 4.

The film 6 is made of polysilicon (p-Si) and has a thickness of, for example, 30 to 80 nm. The polysilicon film 6 is formed on the second gate insulating film 5. The film 6 functions as the channel layer of the bottom-gate TFT 1. It has been formed in two steps. In the first step, an amorphous silicon (a-Si) film is formed to a thickness of 30 to 80 nm, on the second gate insulating film 5 by means of, for example, LPCVD method. In the second step, the amorphous silicon film is annealed and thereby converted to a polysilicon film. The annealing is accomplished by using an excimer laser that is an ultraviolet-ray laser. More specifically, the excimer laser emits a pulse laser beam having a narrow rectangular cross section. The laser beam sweeps the amorphous silicon film in a specific scanning direction, thus polycrsytallizing the amorphous silicon film. The cross section of the laser beam is, for example, 20 cm long and 400 $\mu$m wide, and has pulse frequency of 300 Hz. The scanning direction is set at right angles to the lengthwise direction of the cross section of the pulse laser beam (that is, parallel to the widthwise direction of the pulse laser beam).

The polysilicon film 6 is subjected to impurity ion doping, thus forming a source region and a drain region. The impurity ion doping is carried out after the stopper 7 has been formed on that part of the polysilicon film 6 which lies above the gate electrode 3, thus preventing the impurity ions from entering said part of the polysilicon film 6. The stopper 7 is, for example, a silicon dioxide ($SiO_2$) film having a thickness of 200 nm. It is formed by using the mask used in the process of forming the gate electrode 3.

The first inter-layer insulating film 8 is made of silicon nitride ($SiN_x$) and has a thickness of, for example, 300 nm. The first inter-layer insulating film 8 is formed on the polysilicon film 6.

The second inter-layer insulating film 9 is made of silicon dioxide ($SiO_2$) and has a thickness of, for example, 150 nm. The second inter-layer insulating film 9 is provided on the first inter-layer insulating film 8.

The wires 10 have been formed in three steps. In the first step, two contact holes are made in the first and second inter-layer insulating films 8 and 9, exposing the source region and the drain region formed in the polysilicon film 6. In the second step, an aluminum (Al) film and a titanium (Ti) film are formed in the contact holes and on the second insulating film 9. In the third step, the aluminum film and titanium film are patterned by etching. The wires 10 are electrically connected to the source and drain regions of the transistor, which are provided in the polysilicon film 6, forming the circuit pattern on the glass substrate.

The flattening film 11 is formed after the wires 10 have been formed, defining a flat surface of the bottom-gate TFT 1. The flattening film 11 is 2 to 3 $\mu$m thick.

The transparent conductive film 12 is made of transparent, electrically conductive material such as ITO. The film 12 is a conductor that connects one of the wires 10 (FIG. 1) to an external element or an external wire. It is formed on the flattening film 11 after a contact hole has been made in the flattening film 11. Thus, a part of the transparent conductive film 12 lies on the inner surface and bottom of the contact hole made in the flattening film 11.

Made of polysilicon, the channel layer of the bottom-gate TFT 1 exhibits a very high electric-field mobility. Bottom-gate TFTs of this type may be used in the drive circuit of, for example, a liquid crystal display. If so, the bottom-gate TFTs will enable the liquid crystal display of images of high color quality and operate at high speed, and will render the display smaller in size. In the manufacture of the bottom-gate TFT 1, the amorphous silicon film is annealed by the use of an excimer laser, thus forming the polysilicon film 6. Namely, a low-temperature poly-crystallization process is carried out, suppressing the thermal damage to the glass substrate 2. The glass substrate 2 can therefore be a large, inexpensive heat-resistant glass plate.

Necessity of Inspecting on the Polysilicon Film

As is known in the art, an important factor of the electric-field mobility is the grain size of the polysilicon film 6. The grain size greatly depends on the energy applied to form the polysilicon film 6 during the excimer laser annealing. Hence, the control or stability of the energy of the laser beam applied to anneal the polysilicon film 6 much influences the characteristic and yield of the bottom-gate TFT 1.

Here arises a problem. The excimer laser used to anneal the polysilicon film 6 emits a laser beam whose energy density fluctuates rather greatly. The energy applied to form the polysilicon film 6 inevitably varies so much to fall outside a tolerance range (the manufacture margin of the polysilicon film 6) set for desired grain sizes the film 6 may have. Consequently, it would be difficult for the polysilicon film 6 to always have a desired grain size.

In other words, polysilicon films have greatly different grain sizes even if they have been formed by performing the excimer laser annealing under the same condition, except the energy density of the laser beam. If the energy applied to the amorphous silicon film is excessively large, the amorphous silicon film will become a polysilicon film that has too small a grain size. Conversely, if the energy applied is excessively small, the amorphous silicon film will become a polysilicon film that has too large a grain size. In either case, the bottom-gate TFT 1 cannot attain a sufficient electric-field mobility.

The gate electrode 3 of the bottom-gate TFT 1 lies below the polysilicon film 6. During the excimer laser annealing, more heat transfers to that part of the polysilicon film 6 which lies above the gate electrode 3 than to the other parts of the film 6, which are the source region and the drain region. As a result, the first-mentioned part of the film 6 is melt and solidified faster than the other parts of the film 6, even if the energy density of the laser beam remains unchanged. The first-mentioned part of the film 6 therefore has one grain size, whereas the other parts have another grain size. More precisely, the first part of the film 6 has a smaller grain size than the other parts (i.e., source region and drain region) if the energy density of the laser beam remains unchanged during the excimer laser annealing.

Therefore, it is necessary for the excimer laser to apply energy to form the polysilicon film 6 in such an amount that the part of the film 6, lying above the gate electrode 3 and the parts of the film 6 which are the source and drain regions have desired grain sizes. This means a decrease in the manufacture margin of the polysilicon film 6.

The polysilicon film 6 may fail to have a uniform thickness over the entire glass substrate 2, due to the operating errors of the CVD apparatus that forms the amorphous silicon film. For instance, the central part of the film 6 may be thicker than the peripheral part. In this case, the energy density in the thick part differs from that in the thin part, even if the laser beam the excimer laser emits does not change in energy density. This results in a difference in grain size between the thick part and the thin part. More precisely, the thick part will have a smaller grain size than the thin part if the laser beam does not vary in energy density.

It is therefore necessary for the excimer laser to apply energy to form the polysilicon film 6 in such a larger amount that the thin and thick parts of the film 6 may all have desired grain sizes. Consequently, the manufacture margin of the polysilicon film 6 will be even narrower.

As pointed out above, the excimer laser used in the excimer laser annealing emits a laser beam that much varies in energy density. It is difficult to reduce the energy density of the beam so that the parts of the film 6, which are the source and drain regions, and the part of the film 6, lying above the gate electrode 3, may have desired grain sizes.

Figure 2:
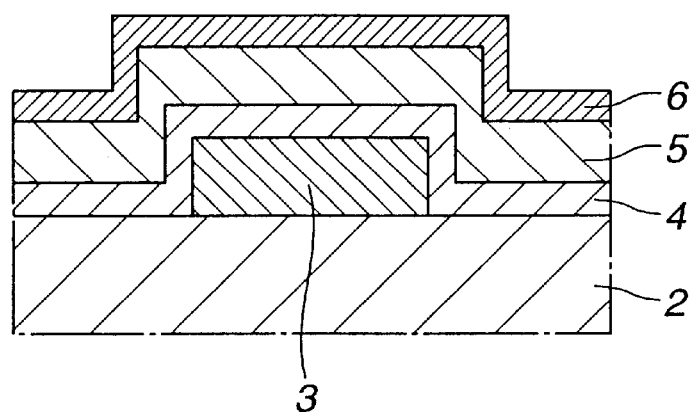
FIG. 2 is a sectional view of a part of the TFT having a polysilicon film.

Generally, the polysilicon film 6 is inspected for its surface crystal condition after it has been subjected to a poly-crystallization process effected by using an excimer laser, as is illustrated in FIG. 2. This inspection is carried out on all TFTs formed on the glass substrate 2 or only some of the TFTs, which have been selected at random, thereby to determine whether the TFTs are defective ones or not. Further, the information representing the energy applied to form the polysilicon film 6 is fed back to the excimer laser. The excimer laser is controlled in accordance with the information, thereby to emit a laser beam having an appropriate energy density.

The apparatus according to this invention evaluates the polysilicon film 6 after the poly-crystallization process has been carried out, thereby to determine whether the TFT having the film 6 is a defective one. The apparatus feeds the information showing the energy applied to the form polysilicon film 6, back to the excimer laser. The excimer laser is controlled based on the information and emits a laser beam having a desired energy density.

Principle and Method of Evaluating the Polysilicon Film (1) The principle of evaluating the polysilicon film formed by the excimer laser annealing described above will be explained.

As indicated above, the electric-field mobility of a bottom-gate TFT greatly depends on the grain size of the polysilicon film incorporated in the TFT. The greater the grain size, the higher the electric-field mobility.

The grain size of the polysilicon film largely depends upon the energy the excimer laser has applied to form the polysilicon film. As seen from FIG. 3, the grain size of the polysilicon film increases with the energy applied, until it reaches value L (hereinafter, referred to as "minimum applicable energy L"). As the energy further increases, the grain size increases at a lower rate until it reaches value H (hereinafter, referred to as "maximum applicable energy H"). After the grain size has reached value H, it increases at a higher rate until it reaches a critical value. Thereafter, the grain size sharply decreases as the energy increases.

Hence, it is desirable to control the energy density of the laser beam so that the energy applied to form the polysilicon film may range from the minimum applicable energy L to the maximum applicable energy H. If a laser beam having energy falling within this range is applied to an amorphous silicon film, the amorphous silicon film will change to a polysilicon film that has a sufficient grain size. Any thin-film transistor that comprises a polysilicon film having a sufficient grain size can exhibit an adequately high electric-field mobility.

Figure 4A:
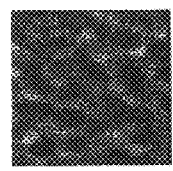
FIG. 4A is the surface image of a polysilicon film formed by performing excimer laser annealing on amorphous silicon at laser energy smaller than an optimal value.
Figure 4B:
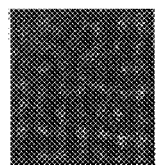
FIG. 4B is the surface image of a polysilicon film formed by effecting excimer laser annealing on amorphous silicon at laser energy of the optimal value.
Figure 4C:
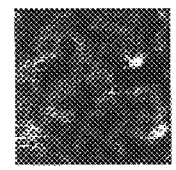
FIG. 4C is the surface image of a polysilicon film formed by effecting excimer laser annealing on amorphous silicon at laser energy greater than the optical value.

(2) Three polysilicon films formed by performing excimer laser annealing on amorphous silicon at optimal laser-energy density, a laser-energy density lower than the optima value and a laser-energy density higher than the optimal value, respectively, are compared in terms of their surface conditions. FIG. 4A is the surface image of the second polysilicon film. FIG. 4B is the surface image of the first polysilicon film. FIG. 4C is the surface image of the third polysilicon film. The three images are ones photographed by a microscope (DUV) that comprises an ultraviolet-ray laser. The microscope will be described later in detail.

In FIGS. 4A to 4C, arrow X indicates the direction in which the amorphous silicon film is scanned with the beam emitted from an excimer laser. The laser beam has a long rectangular cross section that extends in the direction of arrow Y. Thus, the scanning direction is set at right angles to the length of the cross section of the laser beam.

The image of the polysilicon film formed by the annealing effected at the optimal laser-energy density, which is shown in FIG. 4B, differs from the two images of the other polysilicon films, shown in FIGS. 4A and 4C, in the following two respects.

First, the image (FIG. 4B) of the polysilicon film formed by the annealing performed at the optimal laser-energy density exhibits higher linearity than the images (FIGS. 4A and 4C) of the two polysilicon films formed by, respectively, the annealing effected at a lower laser-energy density and the annealing carried out at a higher laser-energy density. To state it another way, the polysilicon film of FIG. 4B, formed by the annealing effected at the optimal laser-energy density, has on its surface a spatial structure that extends in the laser-scanning direction (arrow X).

Secondly, the image (FIG. 4B) of the polysilicon film formed by the annealing performed at the optimal laser-energy density exhibits higher periodicity than the images (FIGS. 4A and 4C) of the other two polysilicon films formed by, respectively, the annealing effected at a lower laser-energy density and the annealing carried out at a higher laser-energy density. More correctly, the polysilicon film of FIG. 4B, formed by the annealing effected at the optimal laser-energy density, has on its surface a spatial structure that has periodicity in the direction of arrow Y.

The apparatus according to this invention examines the surface condition of polysilicon films, utilizing the above-mentioned differences between the image of FIG. 4B, on the one hand, and the images of FIGS. 4A and 4C, on the other. To be more specific, the apparatus of this invention makes a numerical analysis of the surface images of polysilicon films obtained by excimer laser annealing amorphous silicon films. At first, the apparatus determines whether each polysilicon film has a linear spatial structure or a periodical spatial structure on its surface, or whether each polysilicon film has both a linear spatial structure and a periodical spatial structure on its surface. Thus, the apparatus evaluates the polysilicon film provided in a bottom-gate TFT.

(3) A method of performing the numerical analysis on any image of a polysilicon film, which exhibits linearity or periodicity, or both, will be explained below.

Figures 5A, 5B:
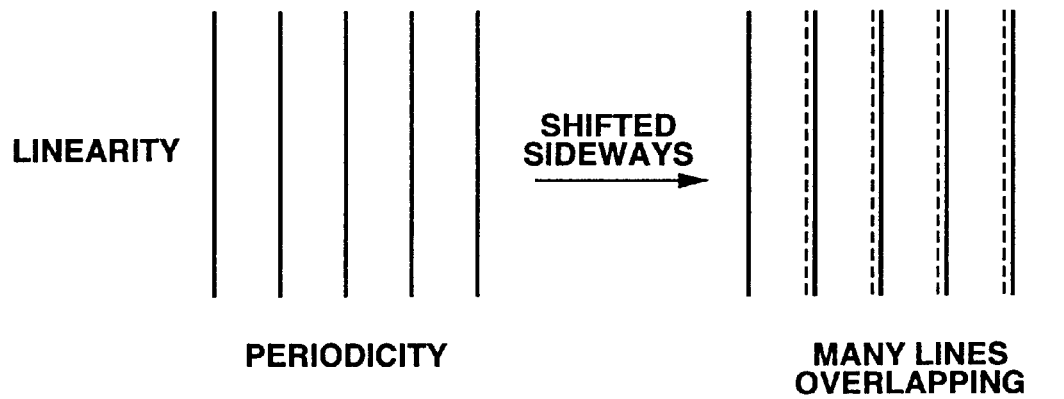
FIGS. 5A and 5B are diagrams showing photographs of polysilicon films, each exhibiting linearity and periodicity.
Figures 6A, 6B:
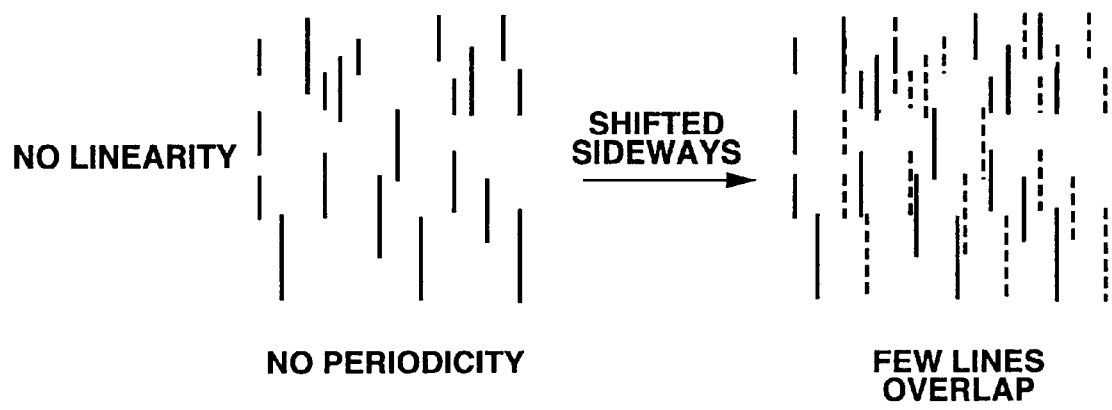
FIGS. 6A and 6B are diagrams depicting photographs of polysilicon films, each exhibiting neither linearity nor periodicity.

An image of a polysilicon film, which has both linearity and periodicity, can be schematically represented as long straight lines that extend parallel and spaced at regular intervals, as is illustrated in FIG. 5A. On the other hand, an image of a polysilicon film, which has neither linearity nor periodicity, can be schematically shown as short lines that form an irregular pattern and spaced at irregular intervals, as is shown in FIG. 6A. To evaluate the linearity and periodicity of an image in numerical values, the image may be copied, and the copied image may then be shifted sideways to see how much it overlap the original image. That is, it is determined how much the copied image is correlated with the original image when it is so moved. For example, a copy of the schematic image of FIG. 5A, shifted by a specific distance, much overlaps the original image (FIG. 5A) as is illustrated in FIG. 5B; it is much correlated with the original image. By contrast, a copy of the schematic image of FIG. 6A, shifted by the same distance, does not overlap the original image (FIG. 6A) as is seen from FIG. 6B; it is not correlated with the original image.

The correlation of the copied image shifted sideways and the original image can be represented by a numerical value. It follows that the periodicity of the image of the polysilicon film can be evaluated in numerical value. One of the methods of achieving numerical evaluation is to first determine the auto-correlation function of the image, then find a peak value of the function and a side-peak value of the function, and finally obtaining the ratio of the peak value to the side-peak value. The term "peak value" is a difference between the correlation value at the origin and the second smallest value in direction y (i.e., the value applied in order to minimize defocusing). (Note that the second smallest value may be replaced by the smallest value, the third smallest value, the fourth smallest value, or the like.), while the term "side peak" is a difference between the correlation value at the second largest value in direction y (the origin is not included) and the second smallest value in direction y.

In the present invention, either the linearity or the periodicity may be evaluated to determine the surface condition of the polysilicon film inspected.

There is another method of achieving numerical evaluation in the case where the photographed image of a polysilicon film exhibits linearity, periodicity, or both. In this method, the values of all pixels constituting an image that has been normalized are added in the direction of linearity and the modulation factor of the resultant sum. A further method is to conduct two-dimensional Fourier transform on a normalized image, thereby to determine the magnitude of a certain frequency component. Still another method is to first extract the coordinates of either the maximum or minimum value in an image (e.g., an image exhibiting linearity in direction y) and then determine the dispersion of the x-coordinates existing in a rectangular region extending in direction y. (The width of the rectangular region is the pitch of arranging pixels in direction x, and the midpoint on the abscissa indicates the average of the x-coordinates exists in the rectangular region.) Another method is to first extract the coordinates of either the maximum or minimum value in an image (e.g., an image exhibiting linearity in direction y) and then find the angle defined by each point, the immediately upper point and the immediately lower point, in a rectangular region extending in direction y. (The width of the rectangular region is the pitch of arranging pixels in direction x, and the midpoint on the abscissa indicates the average of the x-coordinates exists in the rectangular region.)

Structure and Operation of the Apparatus (1) The apparatus of the invention, which is designed to evaluate the linearity and periodicity of the surface spatial structure of the polysilicon film described above will be described below.

The apparatus according to the invention evaluates the surface condition of any polysilicon formed on the substrate of an unfinished bottom-gate TFT, on the basis of a photograph of the polysilicon film prepared by a microscope that comprises a laser that emits an ultraviolet beam having wavelength of 266 nm.

Figure 7:
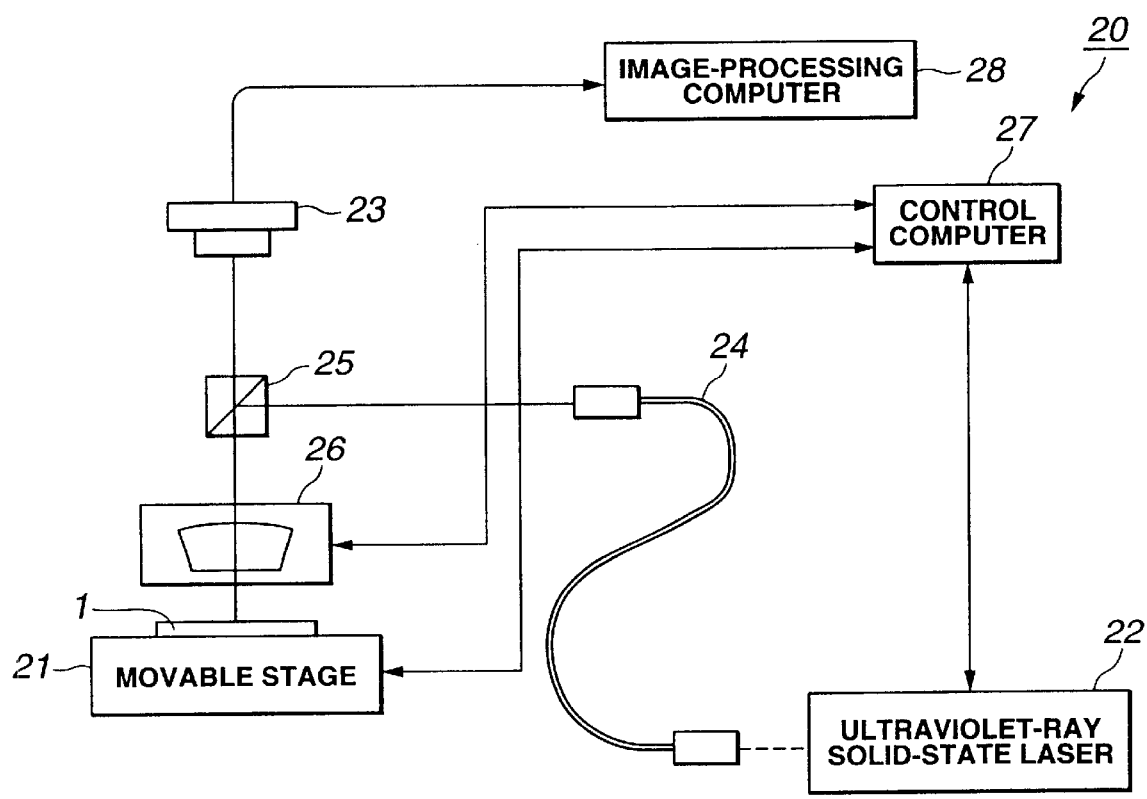
FIG. 7 is a block diagram illustrating an apparatus according to the invention, designed to evaluate polysilicon films.

The apparatus according to the invention has the structure illustrated in FIG. 7.

As shown in FIG. 7, the apparatus 20 comprises a movable stage 21, a ultraviolet-ray solid-state laser 22, a CCD camera 23, an optical-fiber probe 24, a beam splitter 25, an objective lens 26, a control computer 27, and an image-processing computer 28.

The movable stage 21 is provided to support a substrate 1 to be inspected. The substrate 1 has a polysilicon film formed on it. The movable stage 21 can not only support the substrate 1, but also move the substrate 1 to a predetermined inspection position.

The movable stage 21 comprises an X stage, a Y stage, a Z stage, and a suction plate.

The X stage and the Y stage can move, respectively, in two horizontal directions that extend at right angles to each other, for moving the substrate 1 in a horizontal plane to the predetermined inspection position. The Z stage can move in vertical direction, for adjusting the levels of the X stage and Y stage. The suction plate is provided to hold the substrate 1 by a suction force.

The ultraviolet-ray solid-state laser 22 emits an ultraviolet beam having a wavelength of 266 nm. It is, for example, an Nd:YAG 4-fold solid-state laser. Alternatively, the laser 22 may be the recently developed one that emits a beam having a wavelength of about 166 nm.

The CCD camera 23 is very sensitive to ultraviolet rays. The CCD camera 23 comprises an CCD image sensor, which photographs the surface of the substrate 1. The main body of the CCD camera 23 may be cooled to suppress the thermal noise, reading noise, circuit noise and the like that are generated by the CCD image sensor.

The optical-fiber probe 24 functions as a beam-guiding path. It guides the ultraviolet beam emitted from the laser 22, to the beam splitter 25.

The beam splitter 25 reflects the ultraviolet beam emitted from the ultraviolet-ray solid-state laser 22, applying it through the objective lens 26 to the substrate 1 mounted on the movable stage 21. The beam splitter 25 allows the passage of the light reflected from the substrate 1, guiding the light to the camera 3 that has high-sensitivity and low-noise. That is, the beam splitter 25 defines two optical paths, one for guiding the laser beam to the substrate 1, and the other for guiding the light from substrate 1 to the CCD camera 23.

The objective lens 26 is an optical element for receiving the light reflected from the substrate 1, forming a magnified image of the surface of the substrate 1. The lens 26 has a numerical aperture NA of, for example, 0.9, and its astigmatism has been adjusted to wavelength of 266 nm. The objective lens 26 is arranged between the beam splitter 25 and the movable stage 21.

The control computer 27 is provided to control the operation of the ultraviolet-ray solid-state laser 22, the position of the movable stage 21, and the switching of the objective lens 26.

The image-processing computer 28 receives the image data generated by the CCD image sensor incorporated in the CCD camera 23. It analyzes the image data and evaluates the surface condition of the polysilicon film formed on the substrate 1.

In the apparatus 20 described above, the ultraviolet beam emitted from the ultraviolet-ray solid-state laser 22 is applied to the substrate 1 through the optical-fiber probe 24, beam splitter 25 and objective lens 26. The substrate 1 reflects the ultraviolet beam on the surface thereof, which is applied to the CCD camera 23 via the objective lens 26 and the beam splitter 25. In the CCD camera 23, the CCD image sensor converts the light reflected from the substrate 1 into image data representing the surface condition of the polysilicon film. The image data is supplied to the image-processing computer 28.

The image-processing computer 28 evaluates the condition of the polysilicon film based on the data supplied to it, which represents the surface image of the polysilicon. From the condition evaluated, the computer 28 calculates the energy density that the excimer laser beam must have to achieve excimer laser annealing for forming a desirable polysilicon film. Further, the computer 28 determines whether the polysilicon film formed on the substrate 1 is a desired one.

(2) How the image-processing computer 28 evaluates the condition of the polysilicon film will be explained below. This computer 28 first finds a numerical value of the periodicity (hereinafter referred to as "AC value") of the surface image of the polysilicon film, by using auto-correlation function of the polysilicon film. The computer 28 then evaluates the linearity and periodicity of the surface spatial structure of the polysilicon film, thereby to evaluate the condition of the polysilicon film.

Figure 8:
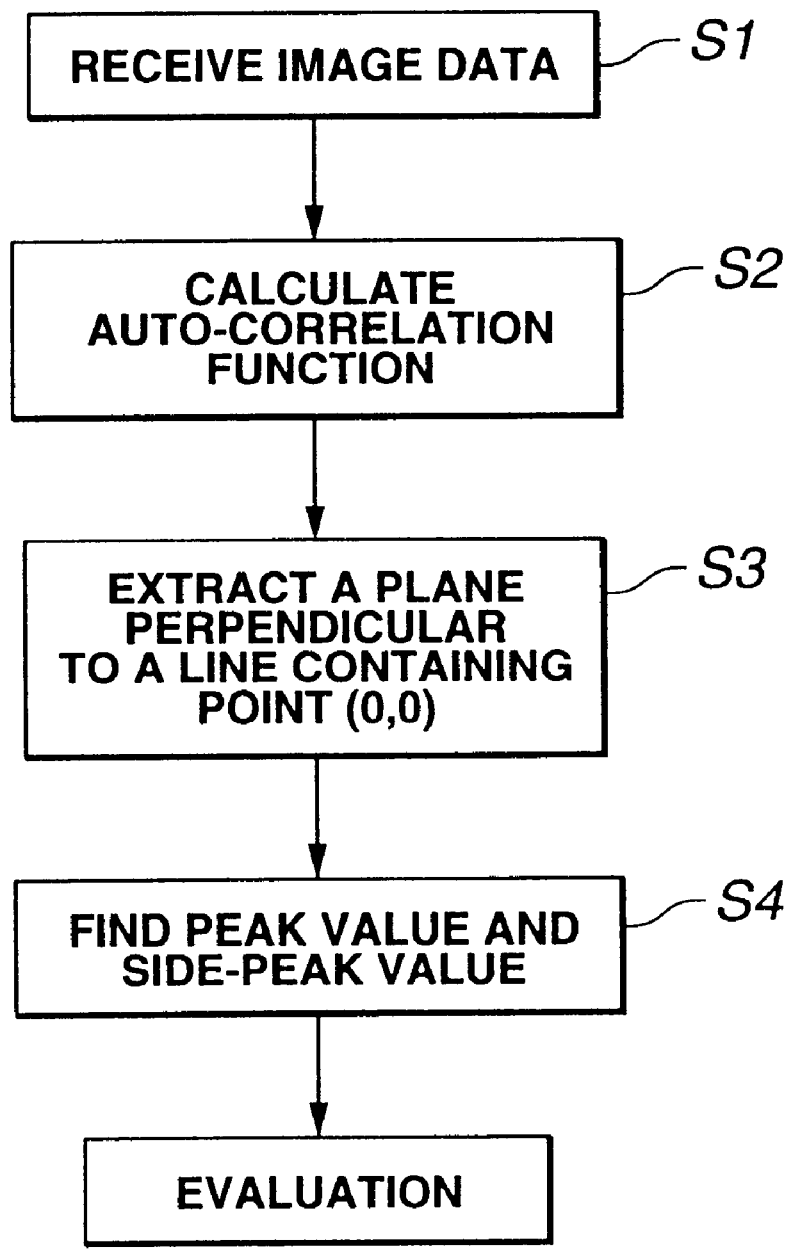
FIG. 8 is a flowchart explaining a procedure of evaluating polysilicon films.

More precisely, the computer 28 evaluates the condition of the polysilicon film in the following steps, as will be described with reference to the flowchart of FIG. 8. First, the computer 28 receives the image data representing the surface image of the polysilicon film (Step S1). The computer 28 then calculates an auto-correlation function from the image data (Step S2). Next, the computer 28 extracts a plane that is perpendicular to a line containing a point (0, 0) in the surface image (Step S3). The computer 28 finds, for the plane thus extracted, the peak value and side-peak value of the auto-correlation function and obtain the ratio of the peak value to the side value, i.e., the AC value (Step S4). Based on the AC value, the computer 28 evaluates the condition of the polysilicon film (Step S5).

The auto-correlation function is given as follows:

$$R(\tau) \lim_{T \to \infty} \frac{1}{T} \int_0^T f(x) f(x+\tau) \, dx$$

The auto-correlation function $R(\tau)$ represents the correlation of a function $f(x)$ that has been moved in parallel in the direction x.

In the apparatus 20, the Winner-Hintin theorem described below is applied to find the auto-correlation function of the surface image of the polysilicon film. The image data received shall be referred to as "image i."

1. First, the image i is subjected to two-dimensional Fourier transform.

:f=fourier (i)

2. Find the square of the Fourier series "f", generating a power vector "ps".

:ps=$|f|^2$

3. Perform inverse Fourier transform on the power vector "ps", generating a two-dimensional auto-correlation function "ac".

:ac=inverse fourier (ps)

4. Find the absolute value of the auto-correlation function "ac", thus obtaining the value "aca" for the auto-correlation function.

:aca=|ac|

Figure 9:
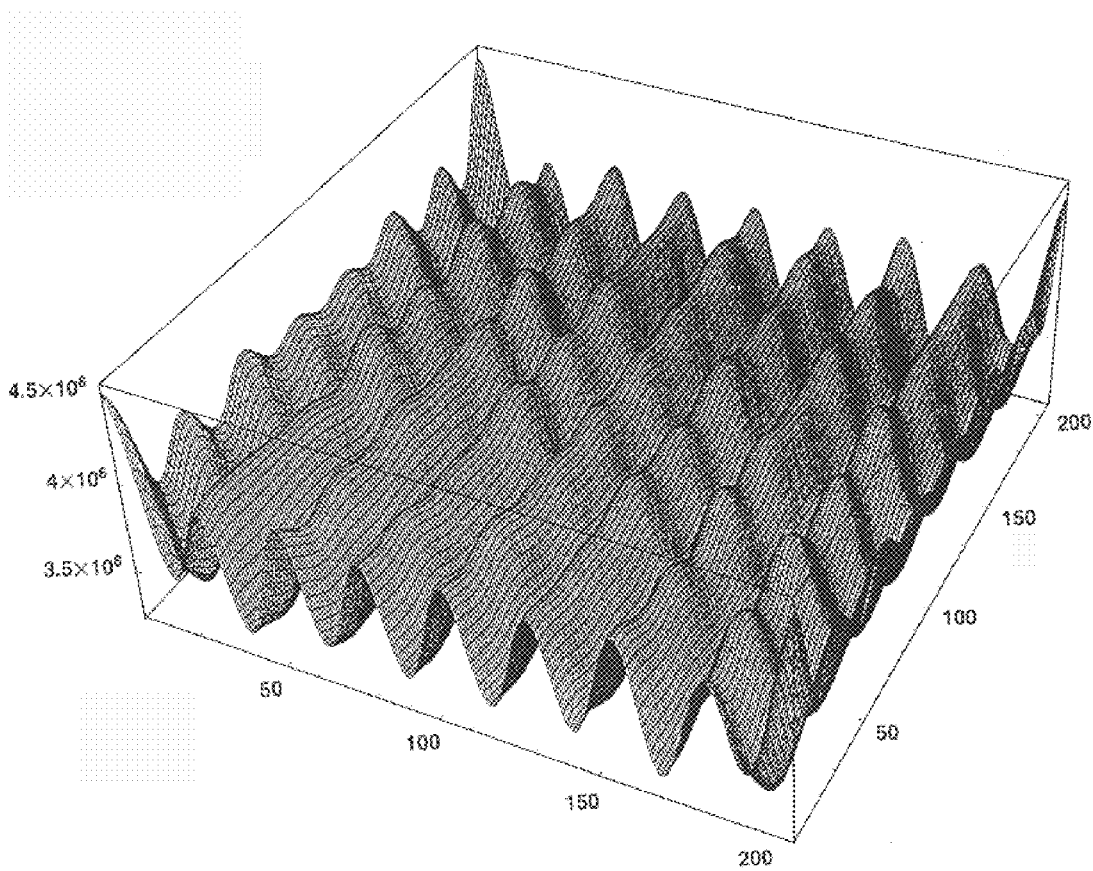
FIG. 9 is a diagram for explaining the auto-correlation function of a polysilicon film that has high periodicity.
Figure 10:
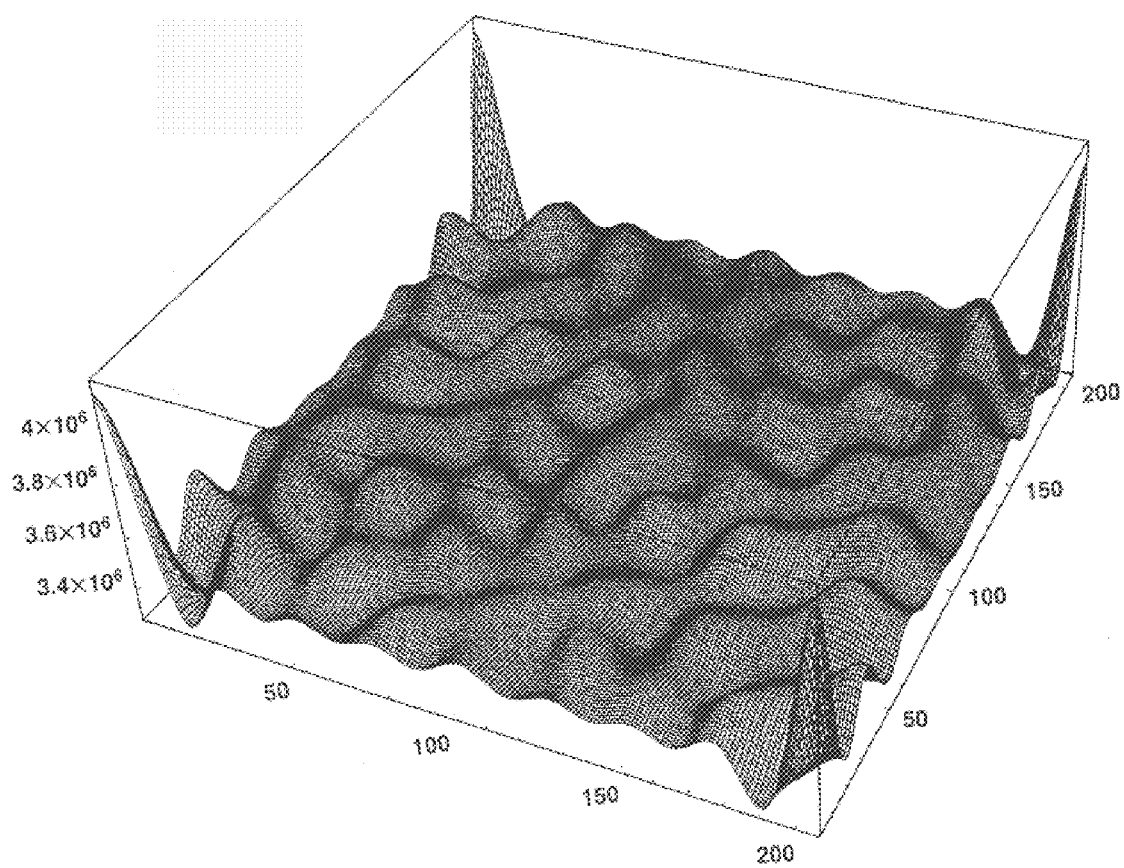
FIG. 10 is a diagram for explaining the auto-correlation function of a polysilicon film that has low periodicity.

The auto-correlation function "aca" thus generated may be illustrated in FIGS. 9 and 10. FIG. 9 represents a high auto-correlation function, i.e., the auto-correlation function of the surface image of a polysilicon film that has a surface spatial structure of good periodicity and high linearity. FIG. 10 represents a low auto-correlation function, i.e., the auto-correlation function of the surface image of a polysilicon film that has a surface spatial structure of inadequate periodicity and low linearity.

In the apparatus 20, the computer 28 extracts a plane that is perpendicular to the alignment direction (i.e., the direction in which the surface spatial structure has linearity) and containing the point (0, 0). The computer 28 finds the function obtained by extracting this plane. The extraction of the plane containing the point (0, 0) is effected for the purpose of normalizing the auto-correlation function that changes in accordance with the experimental parameters such as the amount of light illuminating the substrate 1 and the gain of the CCD image sensor.

The function thus obtained by extracting the plane corresponds to the auto-correlation function $R(\tau)$ for the direction that is perpendicular to the above-mentioned alignment direction.

Figure 11:
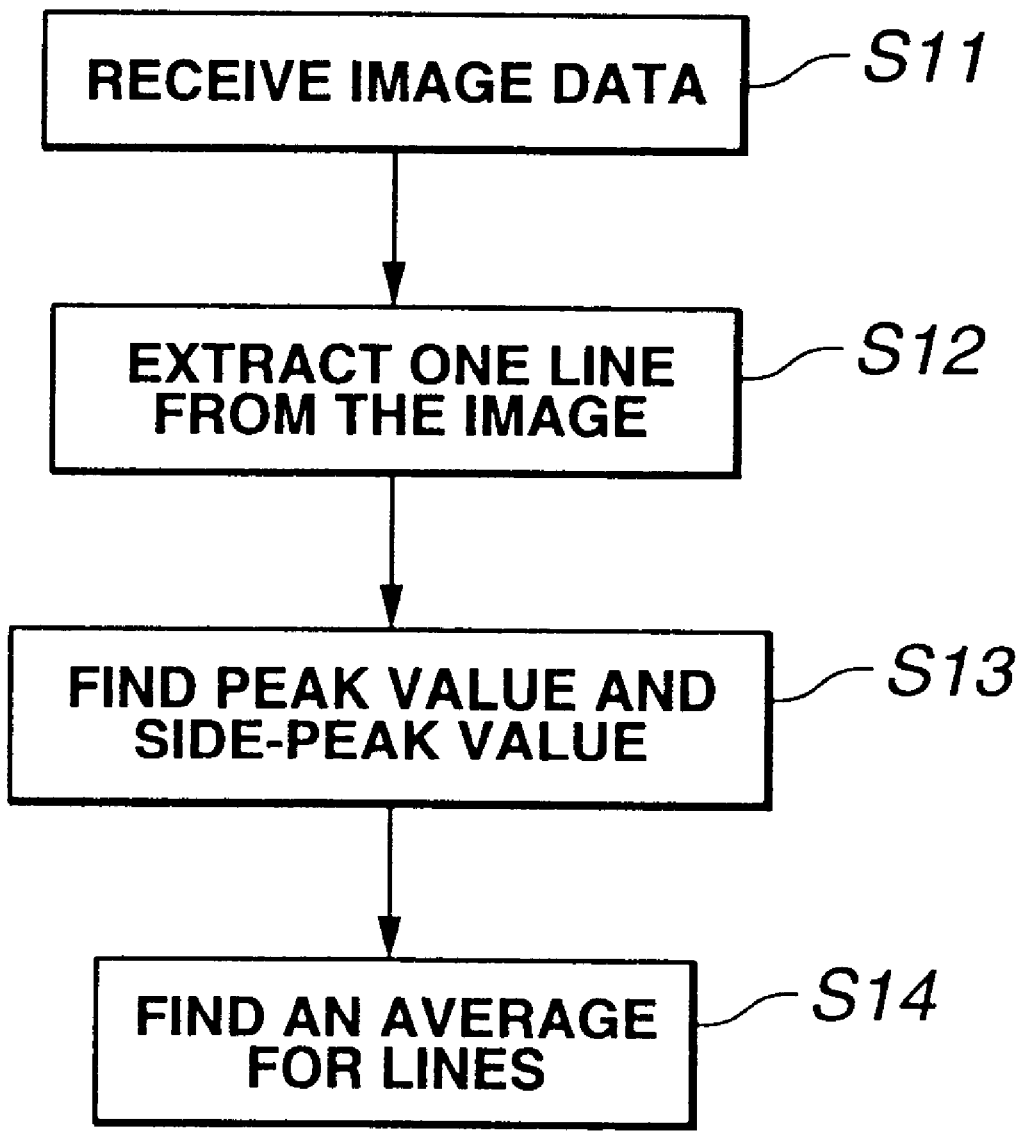
FIG. 11 is a flowchart that explains another procedure of evaluating polysilicon films.

Steps S1 to S3 described above may be replaced by Steps S11 to S14 that are shown in FIG. 11.

In other words, the image-processing computer 28 may evaluate the condition of the polysilicon film, as will be explained with reference to the flowchart of FIG. 11.

First, the computer 28 receives the image data representing the surface image of the polysilicon film (Step S11). Next, the computer 28 extracts one line from the image data, said line extends perpendicular to the laser beam (i.e., direction x in which the surface spatial structure has linearity) (Step S12). The computer 28 calculates an auto-correlation function for the line extracted (Step S13). The computer 28 repeats, if necessary, Steps S11 to S13, for other lines, thereby finding an average auto-correlation function of the lines. (Step S14)

The auto-correlation function can be determined by applying the Winner-Hintin theorem, as will be described below. It should be noted that the image data representing each line extracted is "1."

1. The line "1" extracted is subjected to Fourier transform.

:f1=fourier (1)

2. Find the square of the Fourier series "f1", generating a power spector "ps1".

:ps1=|f1|²

3. Perform inverse Fourier transform on the power spector "ps1", generating a two-dimensional auto-correlation function "ac1".

:ac1=inverse fourier (ps1)

4. Find the absolute value of the auto-correlation function "ac1", thus obtaining the value "aca1" for the auto-correlation function.

:aca1=|ac1|

Figure 12:
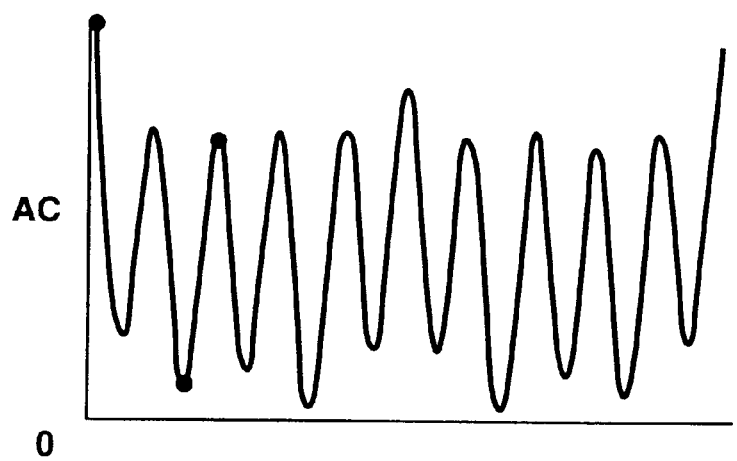
FIG. 12 is a graph explaining an auto-correlation image of a polysilicon film that is found to exhibit high periodicity in the procedure of the flowchart of FIG. 11.
Figure 13:
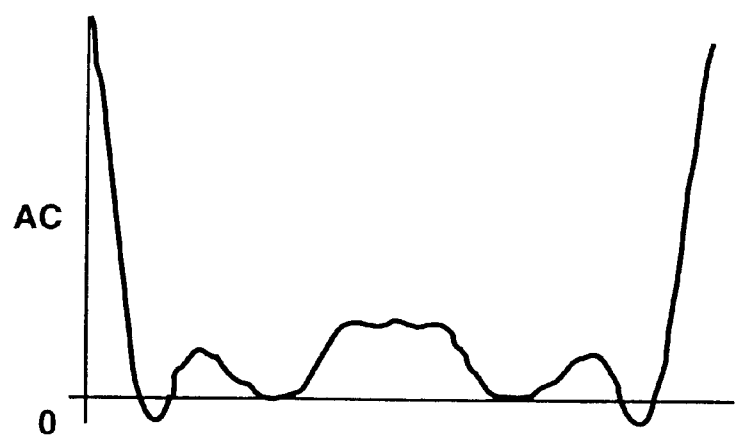
FIG. 13 is a graph explaining an auto-correlation image of a polysilicon film that is found to exhibit low periodicity in the procedure of the flowchart of FIG. 11.

The auto-correlation function aca1, thus generated, can be represented in FIGS. 12 and 13. FIG. 12 represents a high auto-correlation function, i.e., the auto-correlation function of the surface image of a polysilicon film that has a surface spatial structure of good periodicity and high linearity. FIG. 13 represents a low auto-correlation function, i.e., the auto-correlation function of the surface image of a polysilicon film that has a surface spatial structure of inadequate periodicity and low linearity.

Auto-correlation functions are generated for all lines of the image represented by the image data the computer 28 has received. The average of these auto-correlation functions corresponds to the auto-correlation function $R(\tau)$ for the direction that is perpendicular to the alignment direction (i.e., the direction in which the surface spatial structure has linearity) and containing the point (0, 0).

The apparatus 20 finds the maximum peak value and side-peak value of the auto-correlation function obtained, and calculates the ratio of the maximum peak value to the side value. The ratio is used as the AC value.

As for the surface image of a polysilicon film that has a surface spatial structure of good periodicity and high linearity, the difference between the maximum peak value and the side value is large, and the AC value is great. By contrast, in the case of a polysilicon film that has a surface spatial structure of inadequate periodicity and low linearity, the difference between the maximum peak value and the side value is small, and the AC value is small.

As described above, the surface of the polysilicon film of the bottom-gate TFT1 is photographed, the auto-correlation function of the surface image is calculated, and the linearity and periodicity of the surface spatial structure of the polysilicon film are obtained in numerical values.

Figure 14:
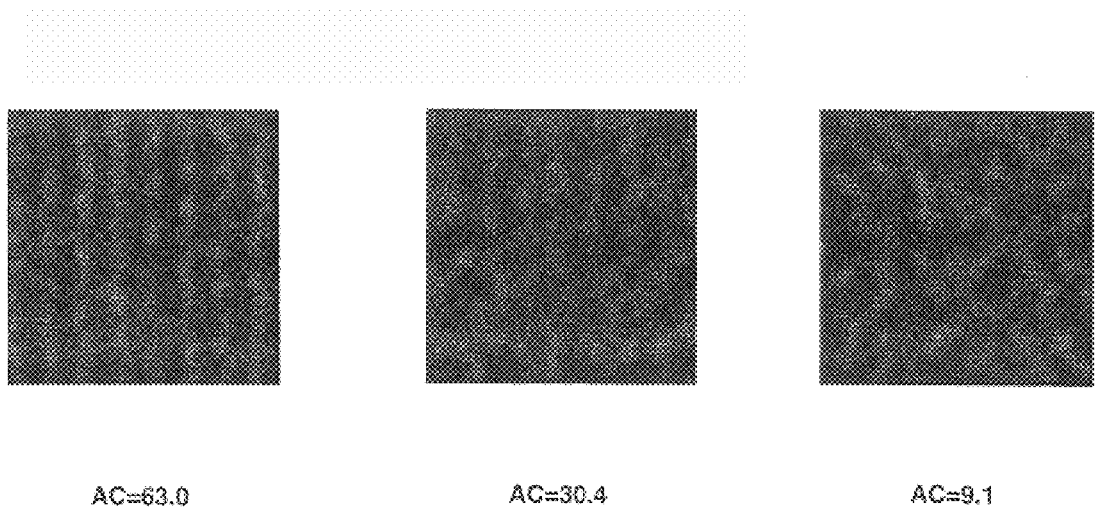
FIG. 14 is a diagram explaining the AC characteristic detected of images actually photographed.

FIG. 14 is a diagram explaining the AC characteristic detected of images actually photographed.

(3) The relation between the AC value thus calculated, the grain size of the polysilicon film and the energy applied to form the polysilicon film will be explained.

Figure 15:
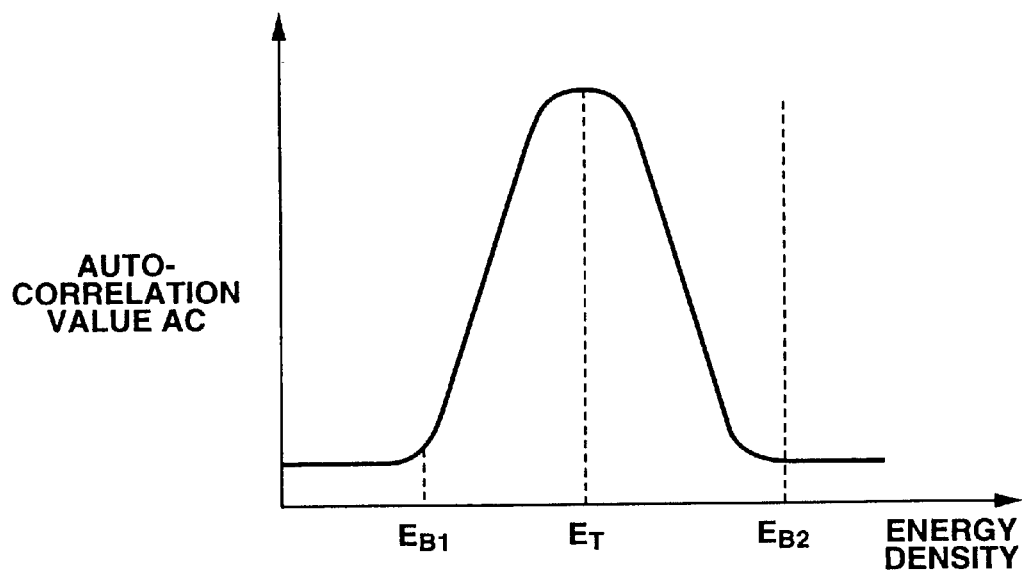
FIG. 15 is graphs representing the relation auto-correlation values have to the energy applied to a form polysilicon film.

FIG. 15 is graphs representing the relation auto-correlation values have to the energy applied to form a polysilicon film. As FIG. 15 reveals, the AC value increases in proportion to the energy applied to form the polysilicon film during the excimer laser annealing, after the energy has reached value $E_{B1}$. The AC value becomes maximal at energy $E_T$. The AC value then decreases in inverse proportion to the energy applied, becoming minimal at energy $E_{B2}$. This is how the AC value depends on the energy applied to the amorphous silicon film during the excimer laser annealing.

Figure 3:
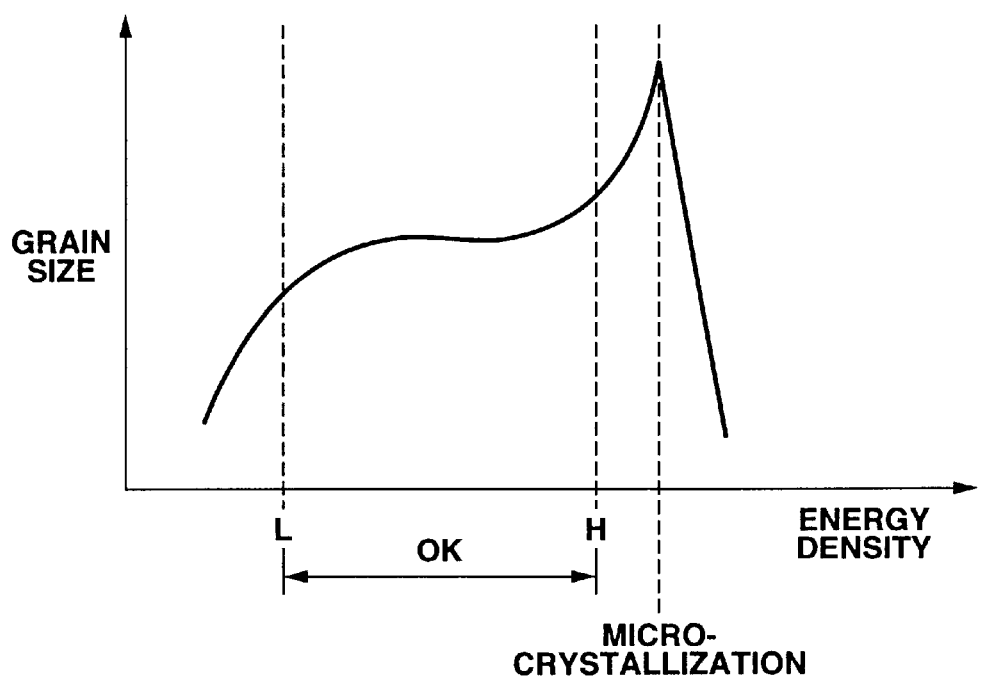
FIG. 3 is a graph representing the relation between the grain size of the polysilicon film and the energy applied by means of excimer laser annealing.
Figure 16:
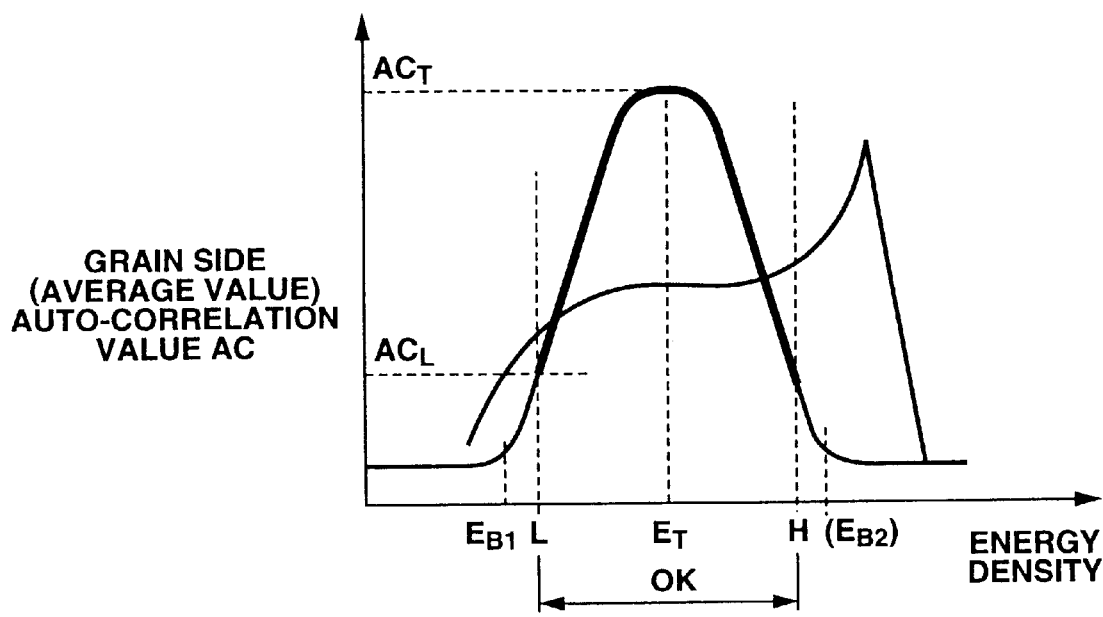
FIG. 16 is a graph illustrating the relation between the energy applied to form a polysilicon film, the AC value and the grain size.

FIG. 16 shows not only the AC characteristic of the surface image, illustrated in FIG. 15, but also the relation between the energy and the grain size of the polysilicon film shown in FIG. 3. As seen from FIG. 16, the maximum AC value falls within the region of appropriate grain size. Further, FIG. 16 shows two important facts. First, the energy $E_{B1}$, at which the AC value starts increasing with the energy applied to the amorphous silicon film, is smaller than the minimum applicable energy L at which the polysilicon film attains the smallest desirable grain size. Second, the energy $E_{B2}$, at which the AC value starts decreasing in inverse portion to the energy applied to the amorphous silicon film, is greater than the maximum applicable energy H at which the polysilicon film attains the smallest desirable grain size.

To determine whether the polysilicon film has an appropriate grain size, from the AC that varies as shown in FIG. 15, it suffices to see whether the AC value falls within the rage indicated by the thick-line curve in FIG. 16.

(4) From the AC value it can be determined whether the polysilicon film is a desirable one or not. One of the two AC values $AC_L$ obtained at the minimum applicable energy L and the maximum applicable energy H, respectively, may be used as a threshold value. If the polysilicon film has an AC value greater than the threshold value, it will be regarded as a desirable one.

The laser beam emitted from the excimer laser may be set at an optimal energy density in accordance with the AC value. In this case, the energy density of the laser beam is changed and the beams of different energy densities are applied to substrates, thus performing laser annealing on each substrate. The AC values corresponding to the energy densities are plotted, thereby drawing a characteristic diagram similar to FIG. 15. From the diagram thus drawn, the best possible energy density may be determined.

In the bottom-gate TFT 1, the gate electrode 3 lies below the polysilicon film 6 as described above. The energy applied during the laser annealing diffuses more into that part of the polysilicon film 6 which lies above the gate electrode 3 than into the other parts of the film 6 which are the source region and the drain region, respectively. Thus, more energy is applied to the first-mentioned part of the film 6 than to the other parts (i.e., source and drain regions) of the film 6, even if the energy is applied in uniform density to the entire polysilicon film. Consequently, the first-mentioned part of the film 6 will have a grain size different from that of the other parts of the film 6.

Generally, it is impossible to apply energy to that part of a polysilicon film which lies above a gate electrode in one density, and to the other parts of the polysilicon film which are the source and drain regions in another density. Thus, energy is applied to the entire polysilicon film in a uniform density.

Figure 17:
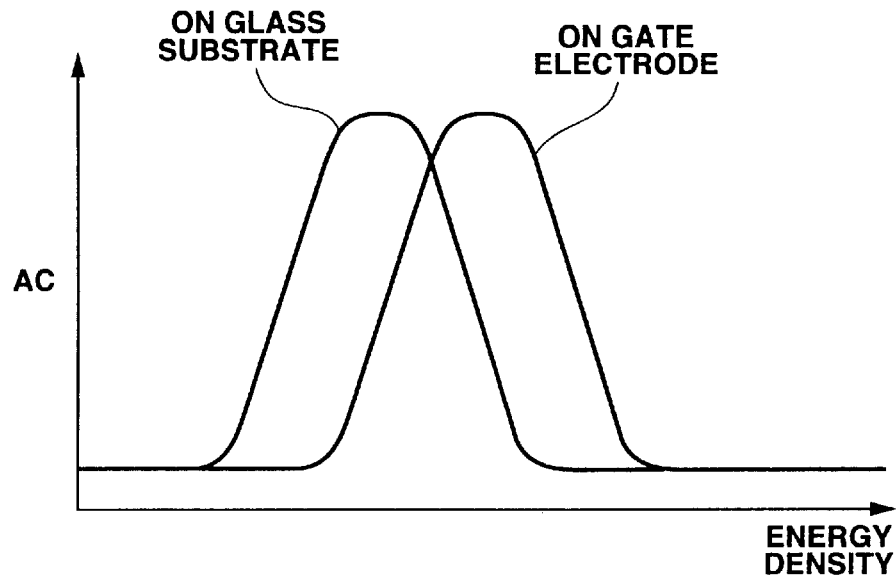
FIG. 17 is a graph showing the relation the AC value has to the energy density of an excimer laser beam in the bottom-gate TFT.

Therefore, in the bottom-gate TFT, the AC value varies with the energy density of the excimer laser beam, as is illustrated in FIG. 17. That is, the AC value has two different peaks, one for that part of the polysilicon film which lies above the gate electrode, and the other for the other part of the polysilicon film which are the source and drain regions. More correctly, the parts (i.e., the source and drain regions) have an AC value reaches its peak at a lower energy density than the part lying above the gate electrode.

Therefore, not only the source and drain regions of the polysilicon film, but also that part of the film which lies above the gate electrode should have the best possible AC value. Then, it is possible to determine whether the polysilicon film is a desirable one, and to set the energy density of the excimer laser beam at an optimal value, merely by evaluating the AC values.

Figure 18:
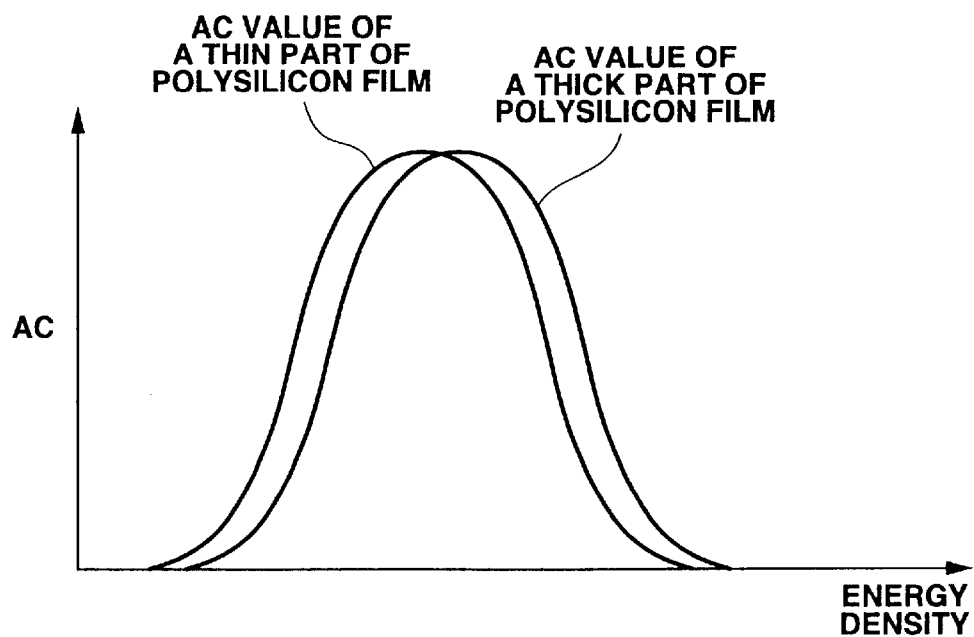
FIG. 18 is a graph illustrating the relation the AC value has to the energy density of an excimer laser beam, for a thick part of a polysilicon film and a thin part thereof.

As shown in FIG. 18, the AC value that depends on the energy density of an excimer laser beam has one peak for a thick part of a polysilicon film and another peak for a thin part thereof. More precisely, the AC value has a peak at a lower energy density, for the thin part than for the thick part.

Figure 19:
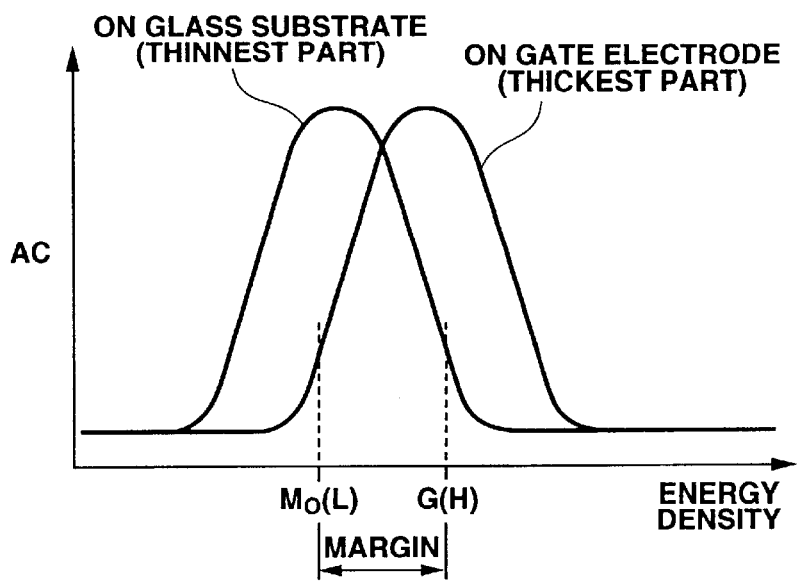
FIG. 19 is a graph showing the manufacture margin of the polysilicon film of a bottom-gate TFT, i.e., the lower and upper limits to the energy density of an excimer laser beam, which are set based on the difference in thickness between the thin and thick parts of the polysilicon film.

Consider the heat diffusion in that part of the polysilicon film which lies above the gate electrode and the difference in thickness between the part of the thin and thick parts of the polysilicon film. Then, it suffices to set the lower and upper limits of energy density as is illustrated in FIG. 19. That is, the lower limit is set based on the AC value of the thinnest part of the source or drain region of the polysilicon film, and the upper limit is set based on the AC value of the thickest part of that part of the polysilicon film which lies above the gate electrode.

Figure 20:
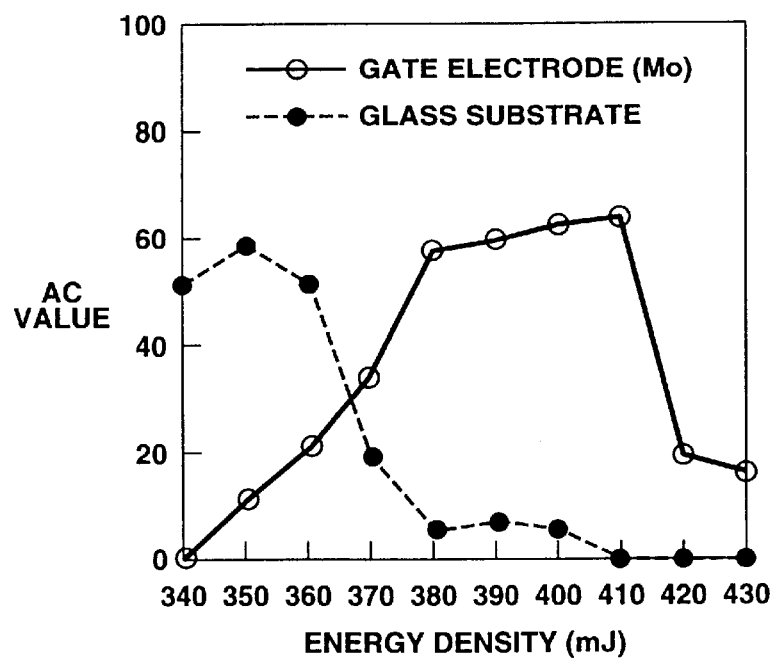
FIG. 20 is a graph showing the relation between the AC value and the energy density of an excimer laser beam, experimentally determined of the polysilicon film of a bottom-gate TFT.

FIG. 20 shows the relation between the AC value and the energy density of an excimer laser beam, experimentally determined of the polysilicon film of the bottom-gate TFT. As can be understood from FIG. 20, the AC value has two peaks, one for that part of the polysilicon film, which lies above the gate electrode, and the other for other parts that are the source and drain regions. FIG. 20 teaches that the best possible energy density is 380 mJ in the excimer laser annealing.

(6) As indicated above, the polysilicon film used in the bottom-gate TFT can be inspected in a non-destructive manner, by evaluating the linearity or periodicity, or both, of the surface spatial structure of the polysilicon film. Hence, the polysilicon film can be inspected during the manufacture of the bottom-gate TFT. Additionally, both the linearity and the periodicity are obtained in the form of numerical values. Automatic inspection of the polysilicon film can therefore be achieved. Further, it is possible to inspection the polysilicon film with high precision. Moreover, the inspection results can be applied to adjust the parameters of the annealing, thereby to enhance the yield of the thin-film transistor.

Figure 21:
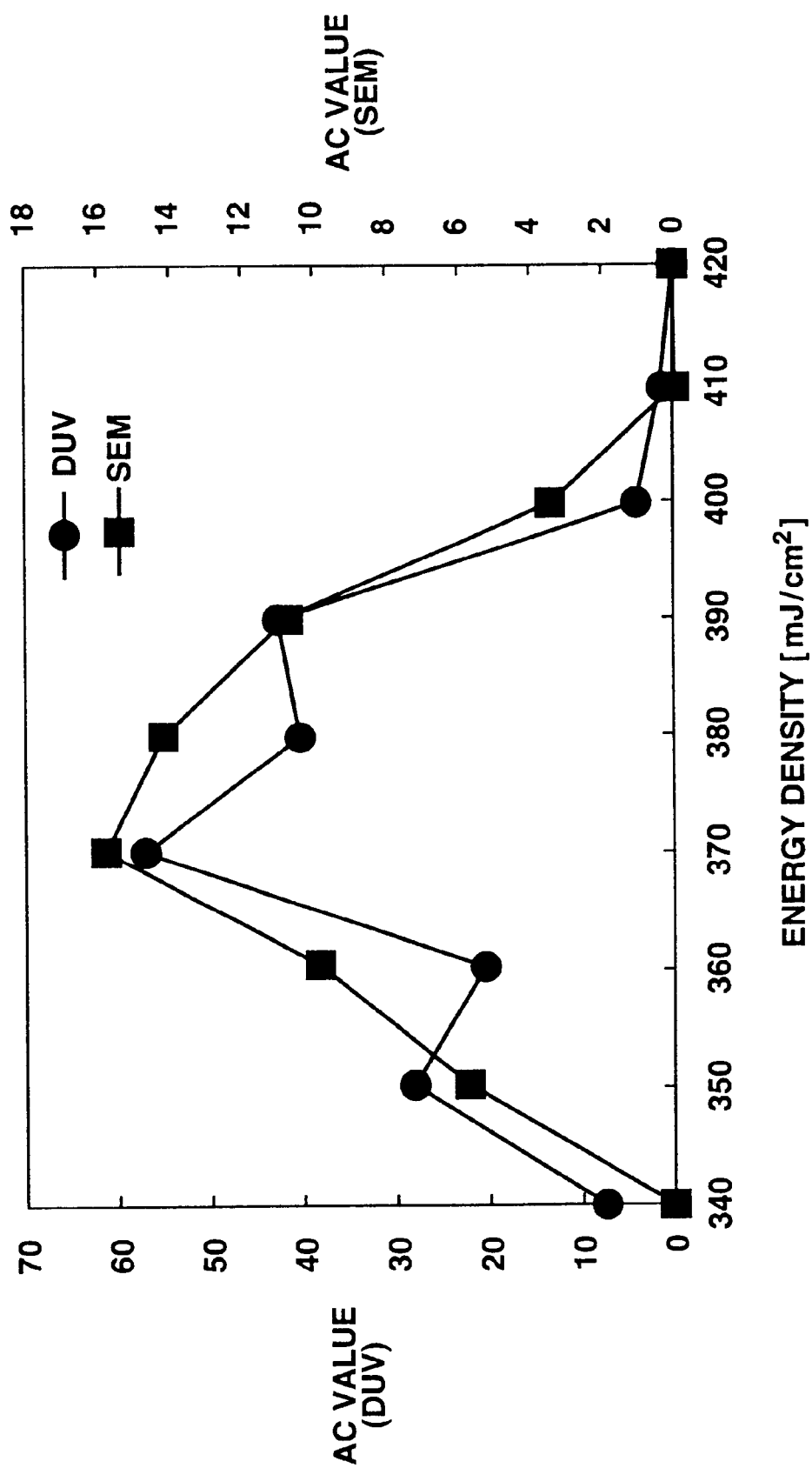
FIG. 21 is a graph illustrating an AC-energy density relation determined from an image photographed by a microscope (DUV) having an ultraviolet-ray laser, and an AC-energy density relation determined from an image photographed by a scanning electron microscope (SEM)

As pointed out above, an ultraviolet-ray solid-state laser that emits an ultraviolet beam having a wavelength of 266 nm is used to photograph the surface of the polysilicon film. The device for photographing the surface of the film is not limited to one having an ultraviolet-ray solid-state laser. Rather, an SEM may be used instead, so that an SEM image of the polysilicon film may be examined to evaluate the linearity or periodicity, or both, of the surface spatial structure of the polysilicon film. FIG. 21 shows the relation between the energy density of the laser beam and the AC value obtained from the image photographed by an SEM, and also the relation between the energy density. FIG. 21 also shows the relation between the energy density of the laser beam and the AC value obtained from the image photographed by a microscope (DUV) comprising an ultraviolet-ray laser. As seen from FIG. 21, the AC value obtained from the DUV is a little smaller than the AC value obtained from the SEM image, because DUV image has lower color quality than the SEM image. Nonetheless, the energy density-AC value relation determined of the DUV image is almost the same as that determined of the SEM image.

Described above is a method of obtaining the linearity and periodicity in the form of numerical values, by applying the auto-correlation function of the surface image of a polysilicon film. Nevertheless, any method that does not use the auto-correlation function of the surface image may be employed in the present invention.

The TFT may have a metal pattern such as a TEG (Test Element Group) or a Cs (accumulated capacitance) that lies below the polysilicon film, like the gate electrode. Heat diffusion occurs in that part of the polysilicon film that lies above the metal pattern, in the same way as in that part of the polysilicon film that lies above the gate electrode. In view of this, it is desirable to calculate the AC value of the metal pattern, as well as the AC value of the gate electrode.

Use of the Apparatus in the Manufacture of Bottom-Gate TFT

It will be described how the apparatus 20 may be used in the manufacture of the bottom-gate TFT.

Figure 22:
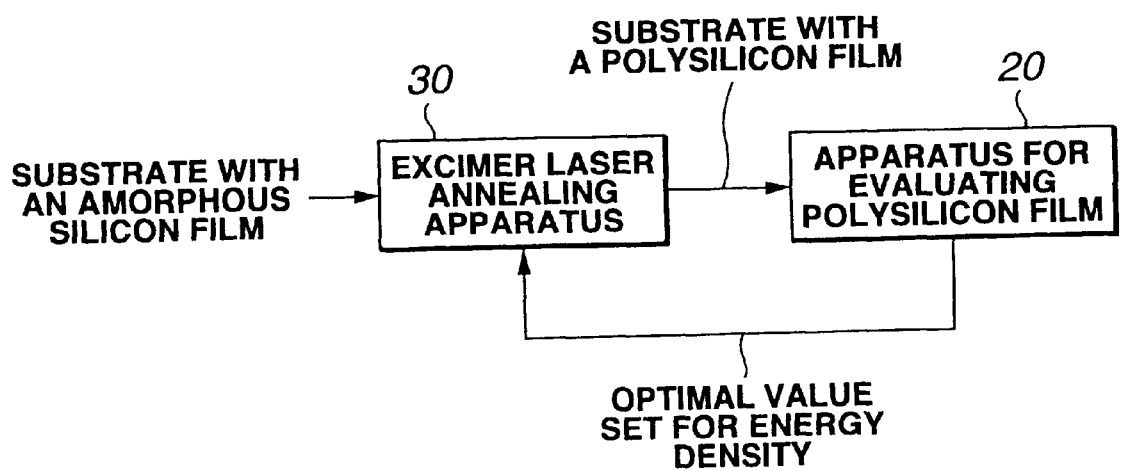
FIG. 22 is a block diagram of an apparatus for manufacturing a bottom-gate TFT, which incorporates the polysilicon-film evaluating apparatus according to this invention.

FIG. 22 shows the apparatus 20 and an excimer-laser annealing apparatus 30. The AC value the apparatus 20 has calculated is supplied to the excimer-laser annealing apparatus 30. In the apparatus 30, the energy density of the laser beam to be emitted is set at an optimal value based on the AC value supplied from the apparatus 20.

The laser beam an excimer-laser annealing apparatuses emits has energy density that differs from the preset value. The energy density varies from the preset value, exhibiting a characteristic like the Gauss distribution. That is, it deviates from the preset energy density to some extent. The manufacture margin of the polysilicon film provided in a bottom-gate TFT, i.e., the energy to be applied to form the polysilicon film, greatly changes with the energy density of the laser beam. (Note that the bottom-gate TFT will be an undesirable product if the energy applied to form the polysilicon film falls outside the manufacture margin.)

Figure 23:
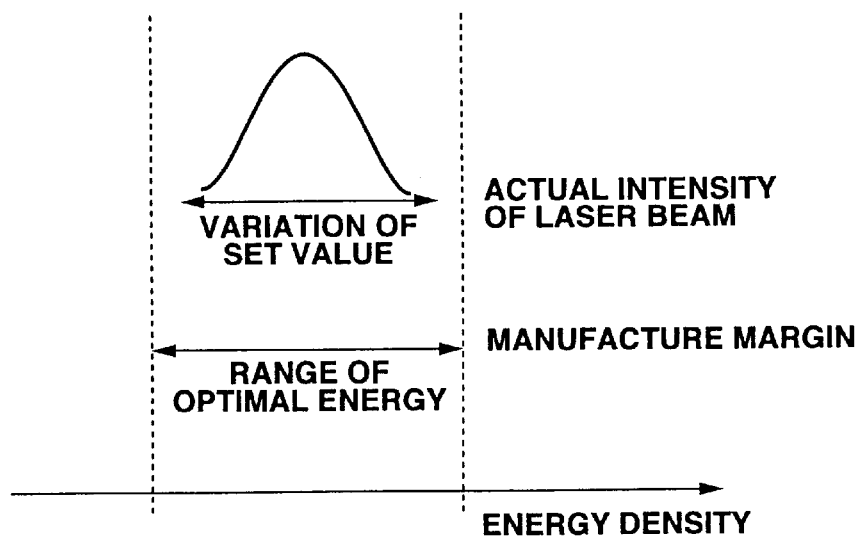
FIG. 23 shows the relation between the energy applied to form a polysilicon film and the energy density of the excimer laser beam, which is observed when an optimal energy density is attained.
Figure 24:
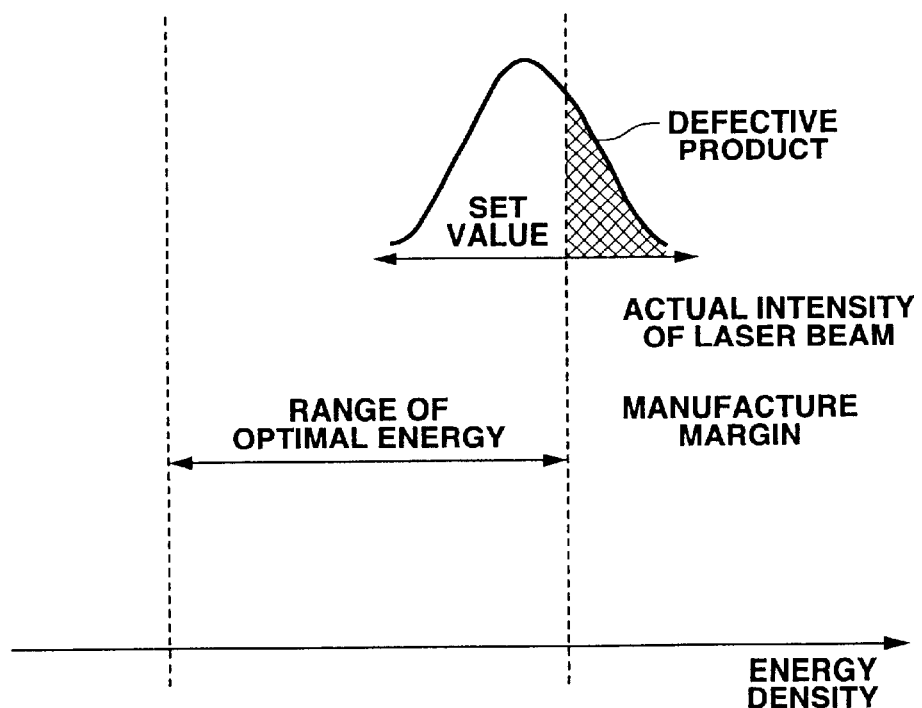
FIG. 24 illustrates the relation between the energy applied to form a polysilicon film and the energy density of the laser beam, which is observed when an optimal energy density is not attained.

Assume the manufacture margin lies within the range of optimal energy as is illustrated in FIG. 23. Also assume the energy density preset for the laser beam falls within this range. Then, the energy applied to form the polysilicon film falls within the manufacture margin even if the energy density of the laser beam deviates from the preset value. In this case, it is possible to manufacture the bottom-gate TFT in high yield. If the energy density preset for the laser beam falls outside the range of optimal energy as shown in FIG. 24, however, the energy applied to form the polysilicon film will fall outside the manufacture margin in most cases. This inevitably lowers the yield of the bottom-gate TFT.

The present invention makes use of the AC-value peak characteristic of bottom-gate TFTs, thereby setting the energy density of the laser beam emitted from the excimer-laser annealing apparatus at the best possible value.

That is, a plurality of glass substrates is prepared, and amorphous silicon films are formed on the substrates. The excimer-laser annealing apparatus applies laser beams having different energy densities to the amorphous silicon films, respectively, thus effecting laser annealing on the amorphous silicon films.

The amorphous silicon film on each substrate changes to a polysilicon film. The AC value of the thickest part of the polysilicon film, which lies above the gate electrode. The AC value of the thinnest parts of the polysilicon film (i.e., source and drain regions) is detected.

Figure 25:
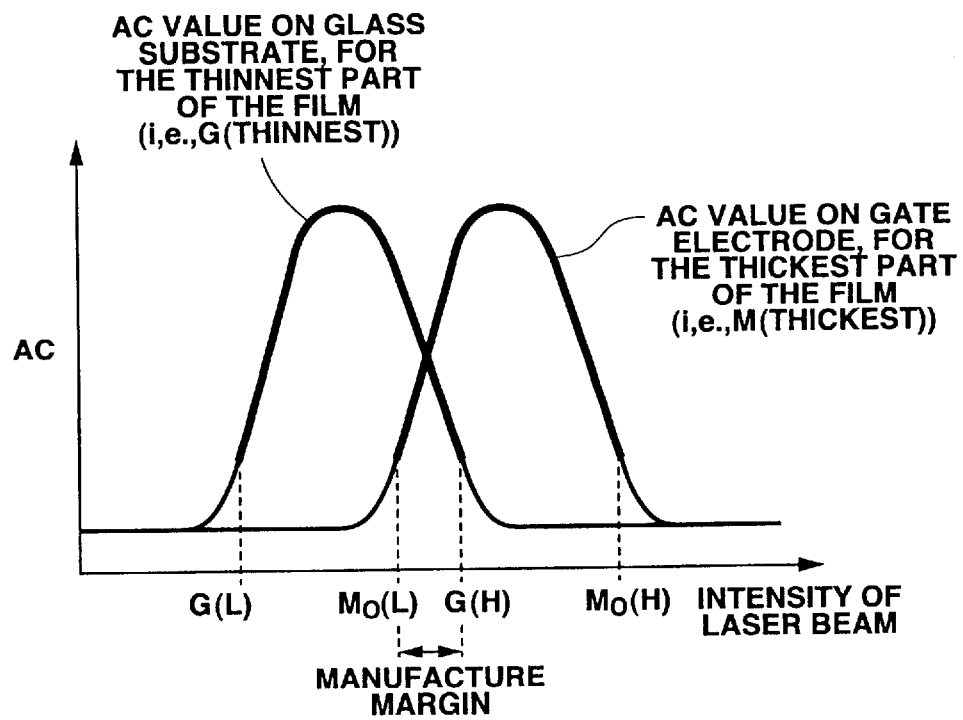
FIG. 25 is a graph representing the relation between the manufacture margin of the polysilicon film provided in a bottom-gate TFT and the energy density of the laser beam applied to form the polysilicon film, for the thickest part of the polysilicon film and the thinnest parts thereof.

The AC values thus obtained of the polysilicon films formed on all glass substrates are plotted in a graph, drawing two AC-value peak characteristic curves as is illustrated in FIG. 25. One of the characteristic curves pertains to the thinnest parts of the respective polysilicon films. The other characteristic curve pertains to the thickest parts of the respective polysilicon films.

From these AC-value peak characteristic curves there can be determined an optimal range of energy density (i.e., the manufacture margin for polysilicon film). More precisely, the energy density for the lower limit of the manufacture margin corresponds to the minimum energy (L) that can be applied to the thickest part of the polysilicon film, which lies above the gate electrode. The lowest energy density is shown as Mo(L) in FIG. 25. On the other hand, the energy density for the upper limit of the manufacture margin corresponds to the maximum energy (H) that can be applied to the thinnest parts of the polysilicon film, which are the source and drain regions. The highest energy density is shown as G(H) in FIG. 25.

The intermediate value of the manufacture margin is thus determined. The energy density at the intermediate value is used as an optimal energy density for the laser beam.

As indicated above, the AC values of the polysilicon films formed on all glass substrates are obtained and plotted in a graph, and an optimal range of energy density (i.e., manufacture margin) is determined. The energy density at the intermediate value of the range is set as the best possible energy density. A laser beam of this energy density thus set is applied to form a polysilicon film in a bottom-gate TFT. This renders it possible to enhance the yield of the bottom-gate TFT.

In the process of determining the manufacture margin, the AC value of the thinnest parts (i.e., source and drain regions) of the polysilicon film is subtracted from the AC value of the thickest part that lies above the gate electrode, thereby obtaining a control parameter, or rating, which is used to evaluate the polysilicon film. That is, rating=(AC value of the thickest part)−(AC value of the thinnest parts).

Figure 26:
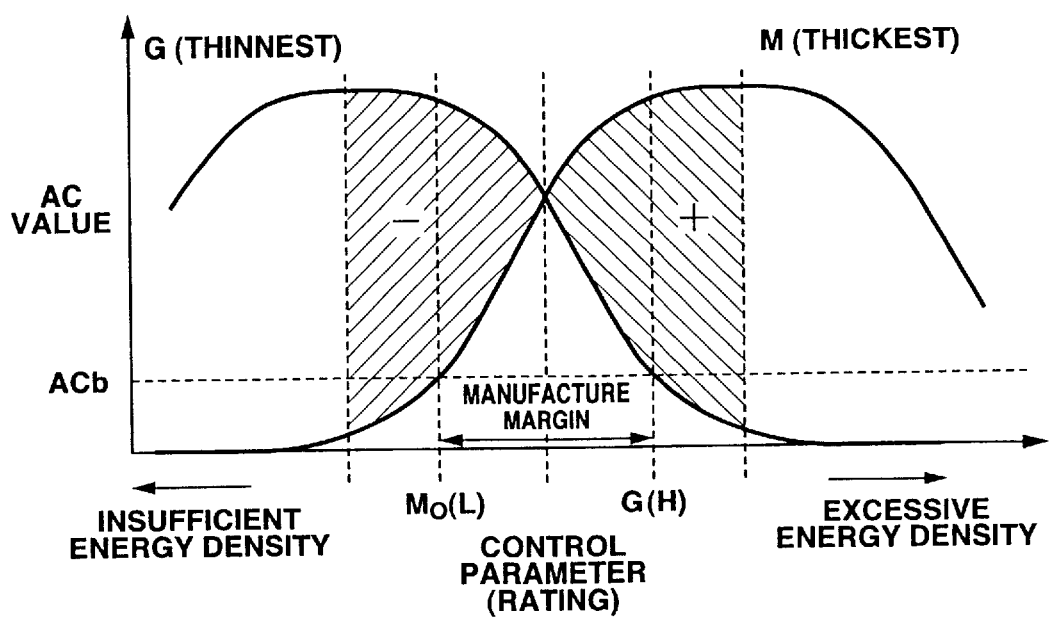
FIG. 26 is a graph explaining the control parameters (rating) that is applied in the process of determining the manufacture margin.

As shown in FIG. 26, the control parameter (rating) is 0 when the laser beam has such an energy density that the thickest part (i.e., the part lying above the gate electrode) has the same AC value as the thinnest parts (i.e., the source and drain regions). The control parameter has a negative value when the laser beam has any insufficient energy density, and a positive value when the laser beam has any excessive energy density.

The lower and upper limits of the manufacture margin may be determined based on the control parameter (rating).

The control parameter greatly influences the ratio of defective products to desirable products. A graph showing the relation between the control parameter and the percent defective may be prepared, and the best possible control parameter may then be obtained from the graph. This helps to determine an optimal energy density for the laser beam.

As pointed out above, the control parameter (rating) is obtained by subtracting the AC value of the thinnest parts of the polysilicon film, from the AC value of the thickest part of the polysilicon film. The control parameter therefore represents the surface spatial structure of the polysilicon film. This means that the control parameter can serve to set the energy density of the laser beam at a desired value.

The control parameter (rating) can be applied not only to set a desired energy density for the laser beam, but also to determine whether the polysilicon film is a desired one or not.

As has been described, the control parameter (rating) is applied, calculating an optimal energy density for the laser beam, and the optimal energy density is fed back to the excimer-laser annealing apparatus. Instead, the manufacture margin may be controlled in accordance with the thickness of the polysilicon film. Namely, it suffices to increase the film thickness when the energy density of the laser beam is too high for the manufacture margin, and decrease the film thickness when the energy density of the laser beam is too low for the manufacture margin.

What is claimed is:

1. A method of manufacturing a thin-film transistor, in which a laser annealing apparatus anneals an amorphous silicon film and converts the amorphous silicon film to a polysilicon film that serves as a channel layer, said method comprising the steps of:

forming a metal pattern on a substrate;

forming an amorphous silicon film on the substrate, thereby covering the metal pattern;

performing laser annealing on a plurality of parts of the amorphous silicon film formed on one or more substrates at different energy densities of a laser beam, thereby forming a polysilicon film;

evaluating, in numerical value, a surface spatial structure of a part of the polysilicon film that lies above the metal pattern;

evaluating, in numerical value, the surface spatial structure of other parts of the polysilicon film; calculating a difference between the numerical value of the part of the polysilicon film that lies above the metal pattern and the numerical value of the other parts of polysilicon film; and controlling the energy density of the laser beam or the thickness of the polysilicon film by using the calculated difference as a control parameter for controlling the energy density and the thickness of the polysilicon film, wherein linearity and/or periodicity of the surface spatial structure of the part of the polysilicon film that lies above the metal pattern is evaluated in a numerical value, and a linearity and/or periodicity of the surface spatial structure of the other parts of the polysilicon film is evaluated in a numerical value.

2. The method according to claim 1, wherein a lower limit of the energy density of the laser beam is set based on a linearity and/or periodicity of the surface spatial structure of a thick portion of the part of the polysilicon film that lies above the metal pattern and an upper limit of the energy density is set based on a linearity and/or periodicity of the surface spatial structure of thin portions of the other parts of the polysilicon film.

3. The method according to claim 2, wherein the energy density of the laser beam is lowered or the thickness of amorphous silicon film is increased when the energy density of the laser beam is at a lower limit, and the energy density of the laser beam is raised or the thickness of the amorphous silicon film is decreased when the energy density of the laser beam is at an upper limit.

4. A method of evaluating a polysilicon film serving as a channel layer and provided in a thin-film transistor that includes a substrate, a metal pattern provided on the substrate, and a channel layer, said polysilicon film having been formed by forming an amorphous silicon film on the substrate and performing laser annealing on the amorphous silicon film, said method comprising the steps of:

evaluating a surface spatial structure of a part of the polysilicon film that lines above the metal pattern in a numerical value;

evaluating surface spatial structure of other parts of the polysilicon film in a numerical value; and calculating a difference between the numerical value of the part of the polysilicon film that lies above the metal pattern and the numerical value of the other parts of polysilicon film, and evaluating the polysilicon film based on the difference calculated.

5. The method according to claim 4, wherein a linearity and/or periodicity of the surface spatial structure of that part of the polysilicon film that lies above the metal pattern is evaluated in a numerical value, and the linearity and/or periodicity of the surface spatial structure of the other parts of the polysilicon film is evaluated in a numerical value.

6. The method according to claim 5, a linearity and/or periodicity of the surface spatial structure of a thick portion of the part of the polysilicon film that lies above the metal pattern is evaluated in a numerical value, and a linearity and/or periodicity of the surface spatial structure of thin portions of the other parts of the polysilicon film is evaluated in a numerical value.

* * * * *